United States Patent
Choi et al.

(10) Patent No.: US 7,972,955 B2
(45) Date of Patent: Jul. 5, 2011

(54) THREE DIMENSIONAL SEMICONDUCTOR MEMORY DEVICE AND METHOD OF FABRICATING THE SAME

(75) Inventors: Sukhun Choi, Suwon-si (KR); Kyunghyun Kim, Seoul (KR); ChangSup Mun, Suwon-si (KR); Byoungkeun Son, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 12/901,025

(22) Filed: Oct. 8, 2010

(65) Prior Publication Data
US 2011/0092038 A1 Apr. 21, 2011

(30) Foreign Application Priority Data
Oct. 19, 2009 (KR) .......................... 10-2009-0099370

(51) Int. Cl.
*H01L 21/8247* (2006.01)
(52) U.S. Cl. ........ 438/618; 438/637; 438/694; 438/740; 257/E23.145; 257/E21.677
(58) Field of Classification Search .................. 438/618, 438/637, 694, 740, FOR. 212; 257/E23.145, 257/E21.677
See application file for complete search history.

(56) References Cited

U.S. PATENT DOCUMENTS

| 7,539,056 B2 | 5/2009 | Katsumata et al. | |
|---|---|---|---|
| 7,558,141 B2 | 7/2009 | Katsumata et al. | |
| 2008/0067583 A1* | 3/2008 | Kidoh et al. | 257/326 |
| 2009/0310425 A1* | 12/2009 | Sim et al. | 365/185.29 |
| 2010/0038703 A1* | 2/2010 | Fukuzumi et al. | 257/326 |
| 2010/0133599 A1* | 6/2010 | Chae et al. | 257/315 |
| 2010/0327323 A1* | 12/2010 | Choi | 257/202 |

FOREIGN PATENT DOCUMENTS

| JP | 2008-171839 | 7/2008 |
|---|---|---|
| JP | 2008-192708 | 8/2008 |
| JP | 2008-258458 | 10/2008 |

OTHER PUBLICATIONS

Tanaka et al., "Bit Cost Scalable Technology with Punch and Plug Process for Ultra High Density Flash Memory", 2007 Symposium on VLSI Technology Digest of Technical Papers, pp. 14-15.

* cited by examiner

Primary Examiner — George Fourson
(74) Attorney, Agent, or Firm — F. Chau & Associates, LLC

(57) ABSTRACT

Provided are a three dimensional semiconductor memory device and a method of fabricating the same. The method includes forming a stepwise structure by using mask patterns and a sacrificial mask pattern formed on the mask patterns as a consumable etch mask.

15 Claims, 37 Drawing Sheets

THREE DIMENSIONAL SEMICONDUCTOR MEMORY DEVICE AND METHOD OF FABRICATING THE SAME

CROSS-REFERENCE TO RELATED APPLICATIONS

This U.S. non-provisional patent application claims priority under 35 U.S.C. §119 of Korean Patent Application No. 10-2009-0099370, filed on Oct. 19, 2009, the entire contents of which are hereby incorporated by reference.

BACKGROUND

The present disclosure herein relates to a three dimensional semiconductor device and a method of fabricating the same.

Higher integration of semiconductor devices is required to satisfy consumer demands for superior performance and inexpensive prices. In the case of semiconductor memory devices, since their integration is an important factor in determining product prices, increased integration is especially required. In the case of typical two-dimensional or planar semiconductor memory devices, since their integration is mainly determined by the area occupied by a unit memory cell, integration is greatly influenced by the level of a fine pattern forming technology. However, the extremely expensive semiconductor equipment needed to increase pattern fineness sets a practical limitation on increasing integration for two-dimensional or planar semiconductor devices.

To overcome such a limitation, three dimensional memory semiconductor memory devices having three-dimensionally arranged memory cells have been proposed. However, in order to mass-produce three dimensional semiconductor devices, a process technology that provides a lower manufacturing cost per bit than two-dimensional memory devices while maintaining or exceeding their level of reliability is required.

SUMMARY

The present disclosure provides a method of fabricating a three dimensional semiconductor device that can reduce manufacturing costs.

The present disclosure also provides a method of fabricating a three dimensional semiconductor device that can reduce manufacturing costs while enhancing reliability of interconnection lines.

The present disclosure further provides a three dimensional semiconductor memory device having enhanced reliability and reduced manufacturing costs.

Embodiments of the present disclosure provide methods of fabricating a three dimensional semiconductor device comprising forming a layer structure comprising a plurality of sequentially stacked layers on a substrate; forming a mask structure on the layer structure; forming a sacrificial mask pattern on the mask structure; and forming a pattern structure comprising a stepwise contact structure by patterning the layer structure by using the mask structure and the sacrificial mask pattern as a consumable etch mask.

In some embodiments of the present disclosure, three dimensional semiconductor devices may comprise: a substrate comprising a cell array region and a contact region; an interconnection structure comprising a plurality of stacked horizontal electrodes and disposed on the substrate; and bit lines disposed on the cell array region, wherein widths of the horizontal electrodes decrease as the horizontal electrodes are further away from the substrate, so that the interconnection structure has a stepwise shape in the contact region. At this time, a sidewall of one of the horizontal electrodes meets the below equation $$L_n(y_m) - L_n(y_0) < \frac{L_n(y_0) - L_{n+1}(y_0)}{s},$$

within a range of $y_m$ meeting the condition of $|y_m - y_0| < y_1$, where $y_0$ is a y coordinate of a reference point, $y_m$, is a y coordinate of a measured point, $L_n(y_m)$ is a distance between a sidewall of a n-th conductive pattern in which the y coordinate is $y_m$, and a sidewall of the bit line most adjacent to the sidewall of the n-th conductive pattern, s is a value of 2 to 20, and $y_1$ is a length shorter than a length of bit line.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
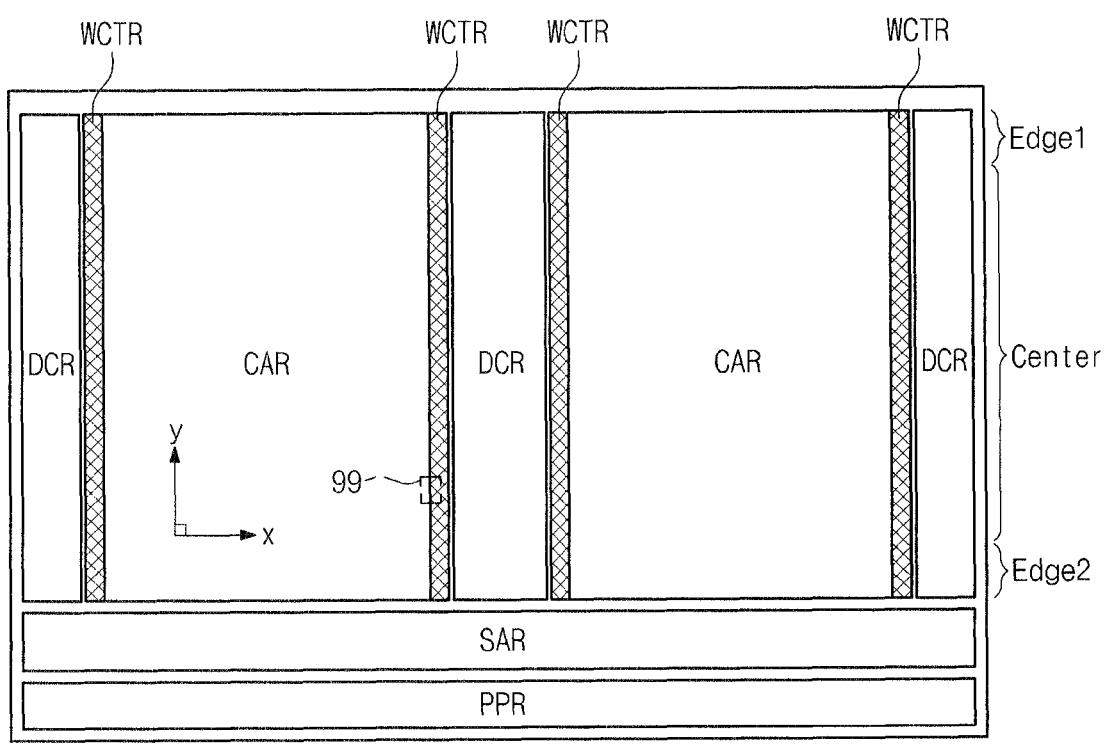
FIG. 1 is a schematic view for describing an embodiment of a semiconductor memory chip according to technical spirit of the inventive concept.

The above objects, other objects, features and advantages of the present disclosure will be better understood from the following description of preferred embodiments taken in conjunction with the accompanying drawings. The present disclosure may, however, be embodied in different forms and should not be constructed as limited to the embodiments set forth herein. Rather, these embodiments are provided so that this disclosure will be thorough and complete, and will fully convey the scope of the present disclosure to those skilled in the art.

In the specification, it will be understood that when a layer (or film) is referred to as being 'on' another layer or substrate, it can be directly on the other layer or substrate, or intervening layers may also be present. Also, in the drawings, the dimensions of layers and regions are exaggerated for clarity of illustration. Also, though terms like a first, a second, and a third are used to describe various regions and layers in various embodiments of the present disclosure, the regions and the layers are not limited to these terms. These terms are used only to discriminate one region or layer from another region or layer. Therefore, a layer referred to as a first layer in one embodiment can be referred to as a second layer in another embodiment. An embodiment described and exemplified herein includes a complementary embodiment thereof.

FIG. 1 is a schematic view for describing an embodiment of a semiconductor memory chip.

Referring to FIG. 1, the semiconductor memory chip according to the present embodiment may include a cell array region CAR, a peripheral circuit region PPR, a sense amp region SAR, a decoding circuit region DCR, and a word line contact region WCTR. In the cell array region CAR, a plurality of memory cells and a plurality of bit lines and word lines for electrical connection with the plurality of memory cells are disposed. In the peripheral circuit region PPR, circuits for operating memory cells are disposed, and in the sense amp region SAR, circuits for reading information stored in the memory cells are disposed. The word line contact region WCTR may be disposed between the cell array region CAR and the decoding circuit region DCR, and an interconnection structure for electrically connecting the word lines and the decoding circuit region DCR may be disposed in the word line contact region WCTR.

The word lines may extend from the cell array region CAR to the word line contact region WCTR, and may form a stepwise structure in the word line contact region WCTR for ease in electrically connecting with the circuits of the decoding circuit region DCR.

Figure 2:
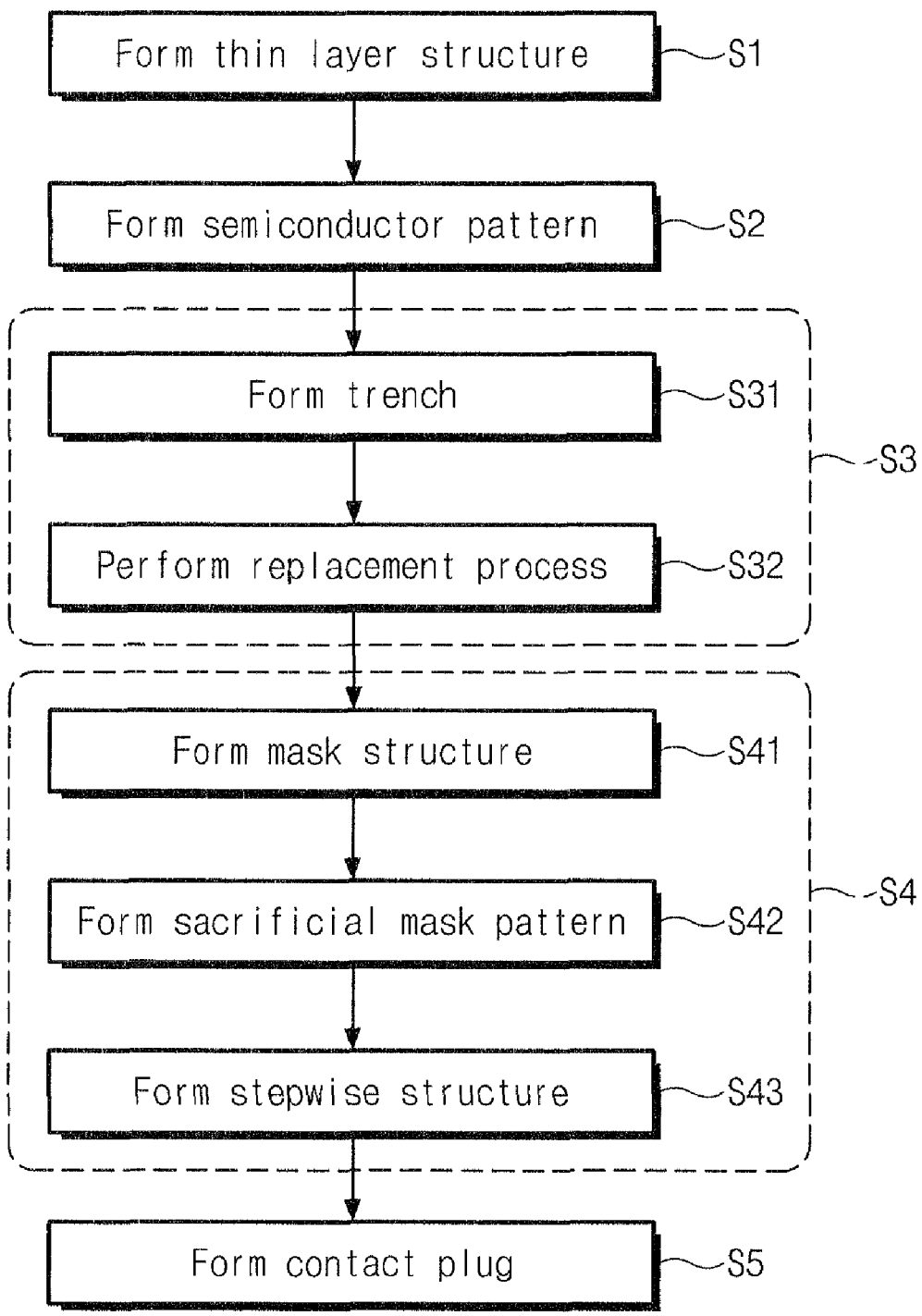
FIG. 2 is a flow diagram for describing a method of fabricating a three dimensional semiconductor device according to a first embodiment based on the technical spirit of the inventive concept.

FIG. 2 is a flow diagram for describing a method of fabricating a three dimensional semiconductor device according to a first embodiment based on the technical spirit of the inventive concept. FIGS. 3 through 18 are perspective views illustrating a method of fabricating a three dimensional semiconductor device according to a first embodiment based on the technical spirit of the inventive concept. FIG. 19 is a perspective view of a three dimensional semiconductor device viewed in a different direction from FIG. 18.

Figure 3:
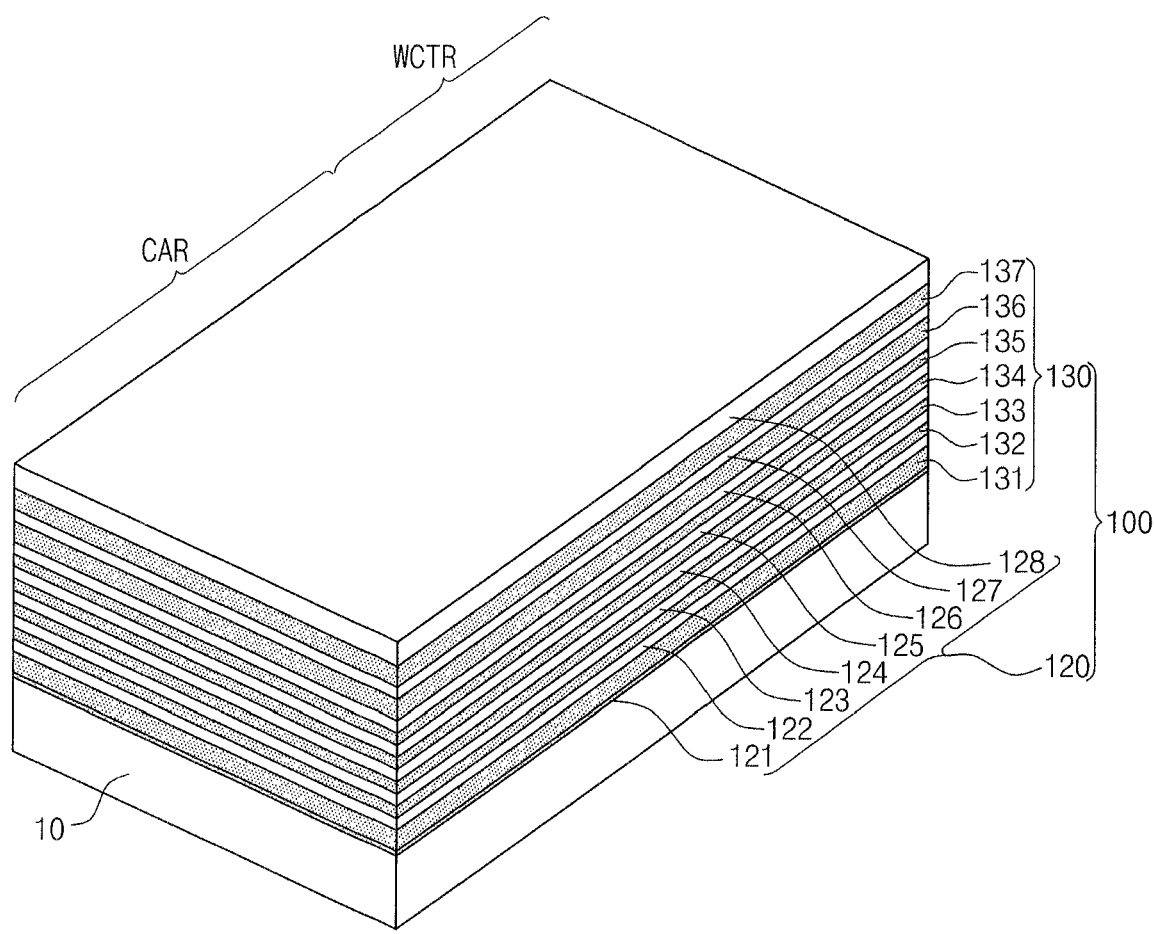
FIGS. 3 through 18 are perspective views illustrating a method of fabricating a three dimensional semiconductor device according to a first embodiment based on the technical spirit of the inventive concept.

Referring to FIGS. 2 and 3, a thin layer structure 100 is formed on a substrate 10 (S1). The substrate 10 may include a cell array region, a peripheral circuit region and a contact region, and these regions may include the same technical features as those described with reference to FIG. 1. The substrate 10 may be one of a material (e.g., silicon, gallium arsenide, indium phosphide, and so on) having semiconductor properties, an insulator (e.g., glass), a semiconductor covered with an insulator, and a conductor.

The thin layer structure 100 may include a plurality of insulating layers 121-128 (120) and a plurality of sacrificial layers 131-137 (130). The insulating layers 120 and the sacrificial layers 130 may be alternately and repeatedly stacked as shown in the figures. The insulating layer 120 and the sacrificial layer 130 may be formed of different materials so that the insulating layer 120 and the sacrificial layer 130 may have an etch selectivity with respect to each other. For example, the insulating layer 120 may be chosen from a silicon oxide layer and a silicon nitride layer, and the sacrificial layer 130 may be a material layer, which may be chosen from a silicon layer, a silicon oxide layer, a silicon carbide layer and a silicon nitride layer and may be different from the insulating layer 120.

According to an embodiment, the fabricating method may, prior to forming the thin layer structure 100, further include forming a conductive region (not illustrated) in or on the substrate 10. If the substrate 10 comprises a semiconductor material, the conductive region may be an impurity region formed in the substrate 10. If the substrate 10 comprises an insulator, the conductive region may be a conductive layer or a conductive pattern disposed on the substrate 10. According to an embodiment, the conductive region may be used as a common source line.

Figure 4:
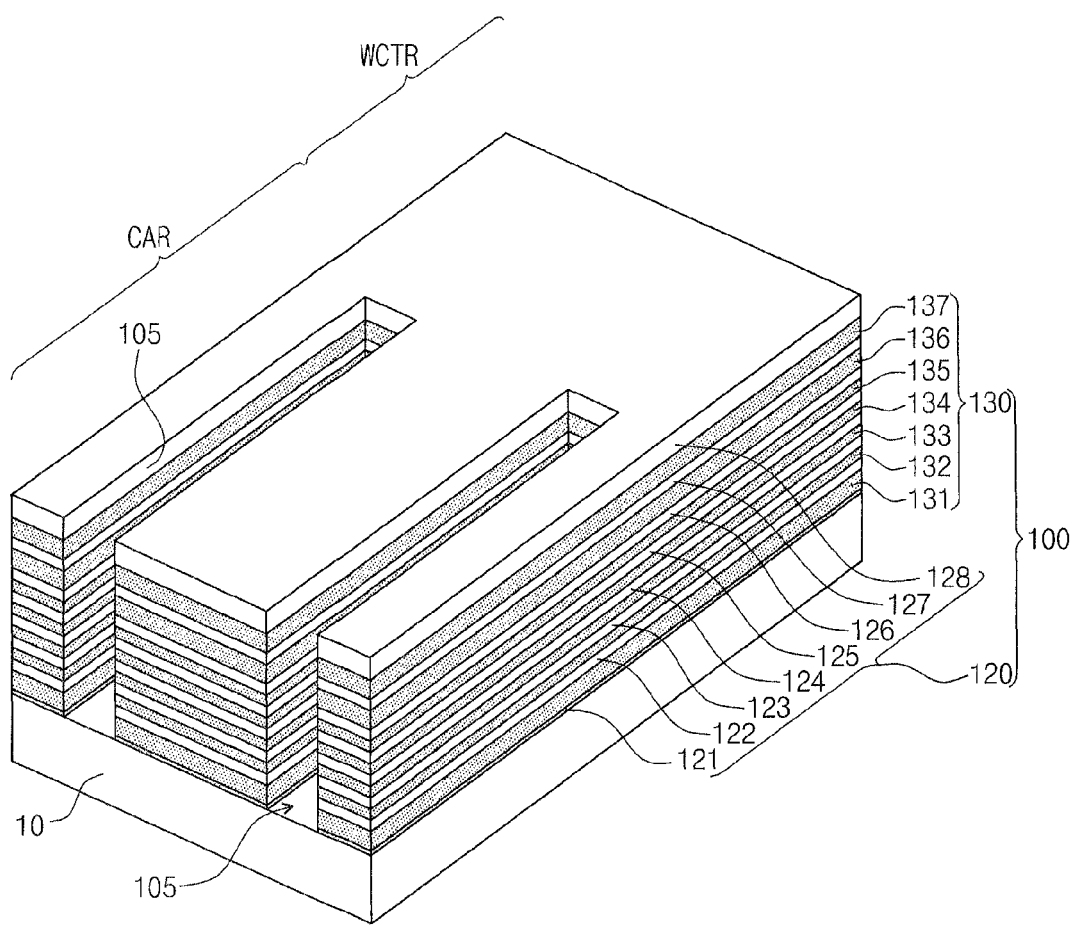
Figure 5:
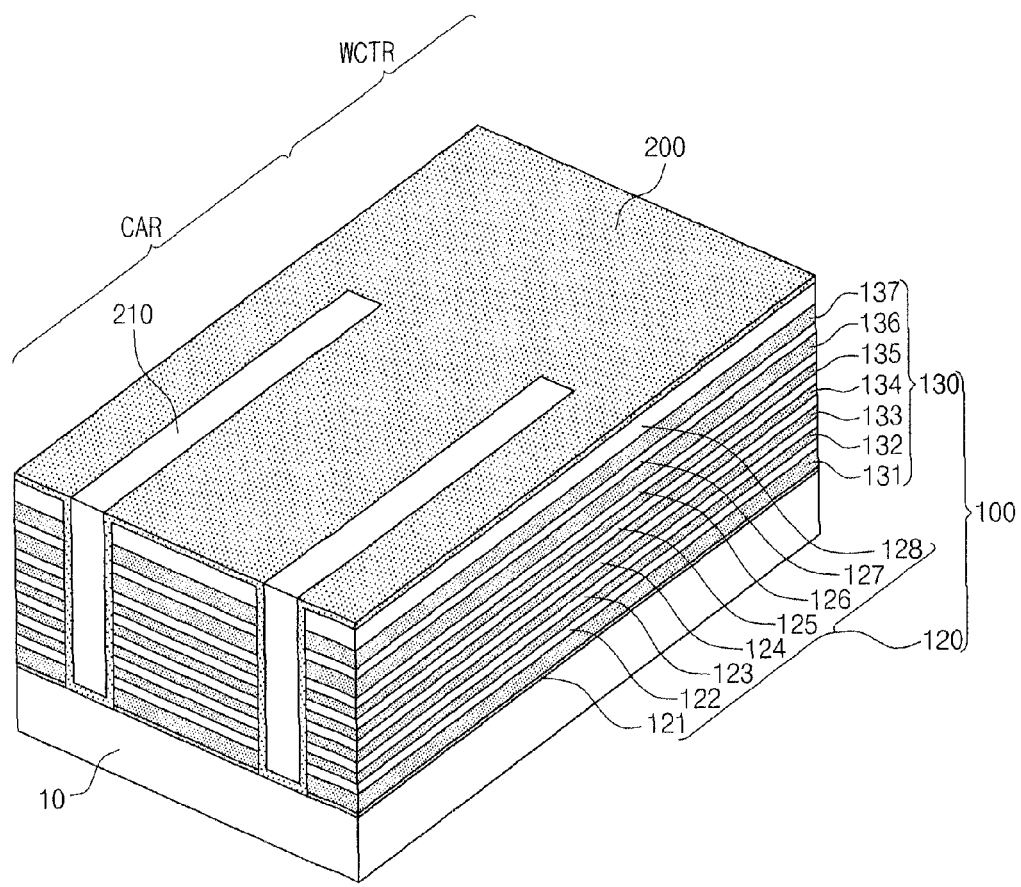
Figure 6:
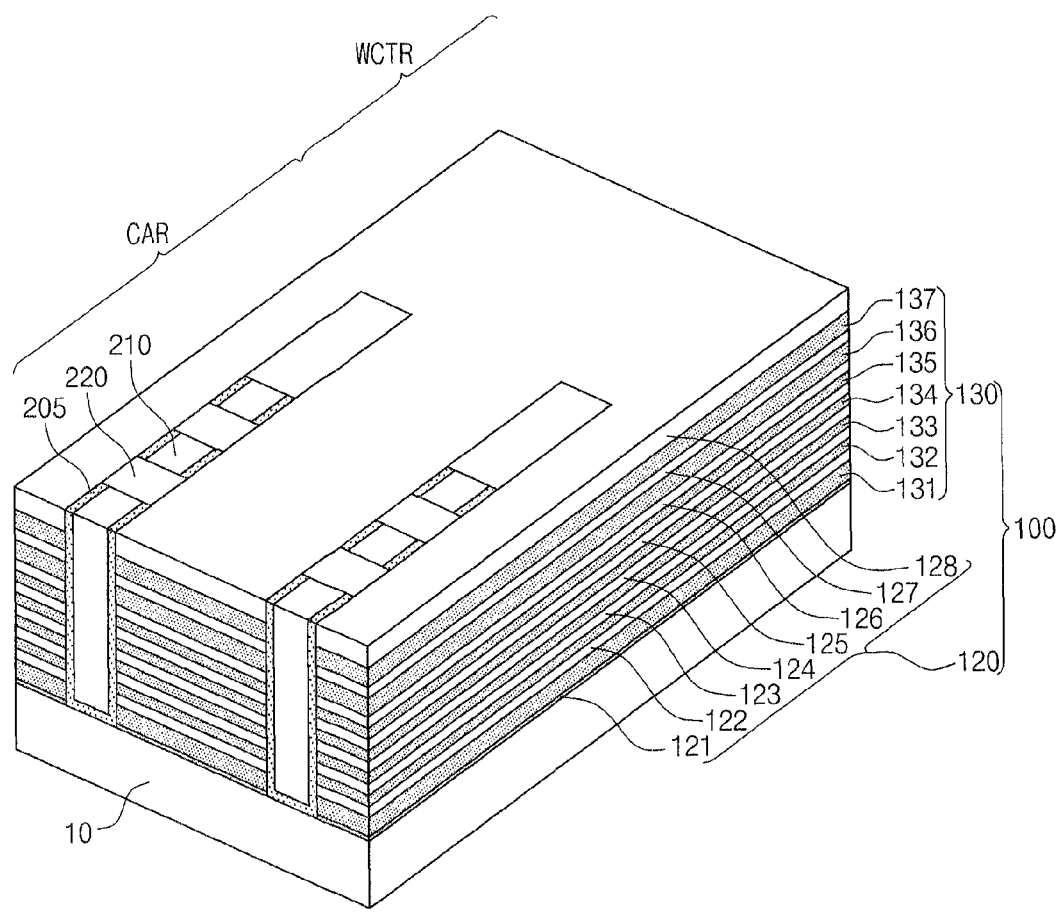

Referring to FIGS. 2 and 4 through 6, semiconductor patterns 205 penetrating the thin layer structure 100 are formed (S2) as explained below. In particular, the forming S2 of the semiconductor patterns 205 may include, after forming openings 105 penetrating the thin layer structure 100 as shown in FIG. 4, forming a semiconductor layer 200 and first buried patterns 210 sequentially filling the openings 105 as shown in FIG. 5, and patterning the semiconductor layer 200 to form semiconductor patterns 205 as shown in FIG. 6.

In some embodiments, the openings 105 may be formed so as to expose a top surface of the substrate 10 or the conductive region. As a result, the semiconductor layer 200 may be formed so as to contact the top surface of the substrate 10 or the top surface of the conductive region. Horizontal sections of the openings 105 may be a rectangular shape having at least 10 or more aspect ratio. Alternatively, according to another embodiment, the horizontal sections may be formed two-dimensionally while having a substantially cylindrical or ellipsoidal shape.

The semiconductor layer 200 may be a semiconductor material (e.g., polysilicon), which is formed by using a chemical vapor deposition (CVD) technique and has a polycrystalline structure. In this case, the semiconductor layer 200 may be formed so as to cover inner walls of the openings 105 in a substantially conformal manner. Alternatively, the semiconductor layer 200 may be one of semiconductor materials formed by using, for example, an epitaxial technique, an atomic layer deposition (ALD) technique or a CVD technique, and may have one of a polycrystalline structure, a single crystalline structure, an amorphous structure or combinations thereof.

The first buried patterns 210 may be formed to fill the openings 105 in which the semiconductor layer 200 is formed, and may include at least one of insulating materials. For example, the first buried patterns 210 may be silicon oxides or insulating materials formed by using a spin-on-glass (SOG) technique. According to an embodiment, in a gas ambient including hydrogen or heavy hydrogen, a hydrogen annealing may be performed to process the resultant structure in which the semiconductor layer 200 is formed. The hydrogen annealing may cure crystal defects existing in the semiconductor layer 200.

Referring to FIG. 6, the semiconductor layer 200 may be patterned to form two or more semiconductor patterns 205 separated from each other in the opening 105, and then second buried patterns 220 filling a space between the semiconductor patterns 205 may be further formed.

The forming of the semiconductor patterns 205 may include exposing an inner sidewall of the semiconductor layer 200 by patterning, i.e., removing a portion of the first buried patterns 210 using an etch mask pattern (not illustrated) arranged perpendicular to the longitudinal direction of the openings, and horizontally separating the semiconductor patterns 205 by etching the inner sidewall of the exposed semiconductor layer 200 until the sidewall of the thin layer structure 100 is exposed.

The second buried patterns 220 may be formed of one or more insulating materials such as a silicon dioxide. According to an embodiment, the forming of the second buried patterns 220 may include forming a second buried layer filling a space between the separated semiconductor patterns 205, and planarizing the second buried layer and the semiconductor layer 200 until a top surface of the thin layer structure 100 is exposed. In this case, nodes of the semiconductor patterns 205 may be separated, so that the semiconductor patterns 205 may be locally formed in the opening 105 adjacent the second buried pattern 220.

Referring to FIGS. 2 and 7 through 9, a horizontal interconnection line forming process of forming conductive patterns 260 (FIG. 9), which are formed to face sidewalls of the semiconductor patterns 205, is performed (S3). The horizontal interconnection line forming process S3 may include forming trenches 230 penetrating some or all of thin layers constituting the thin layer structure 100 between the semiconductor patterns 205 (S31), and replacing the sacrificial layers of the thin layer structure 100 with conductive layers (S32).

Figure 7:
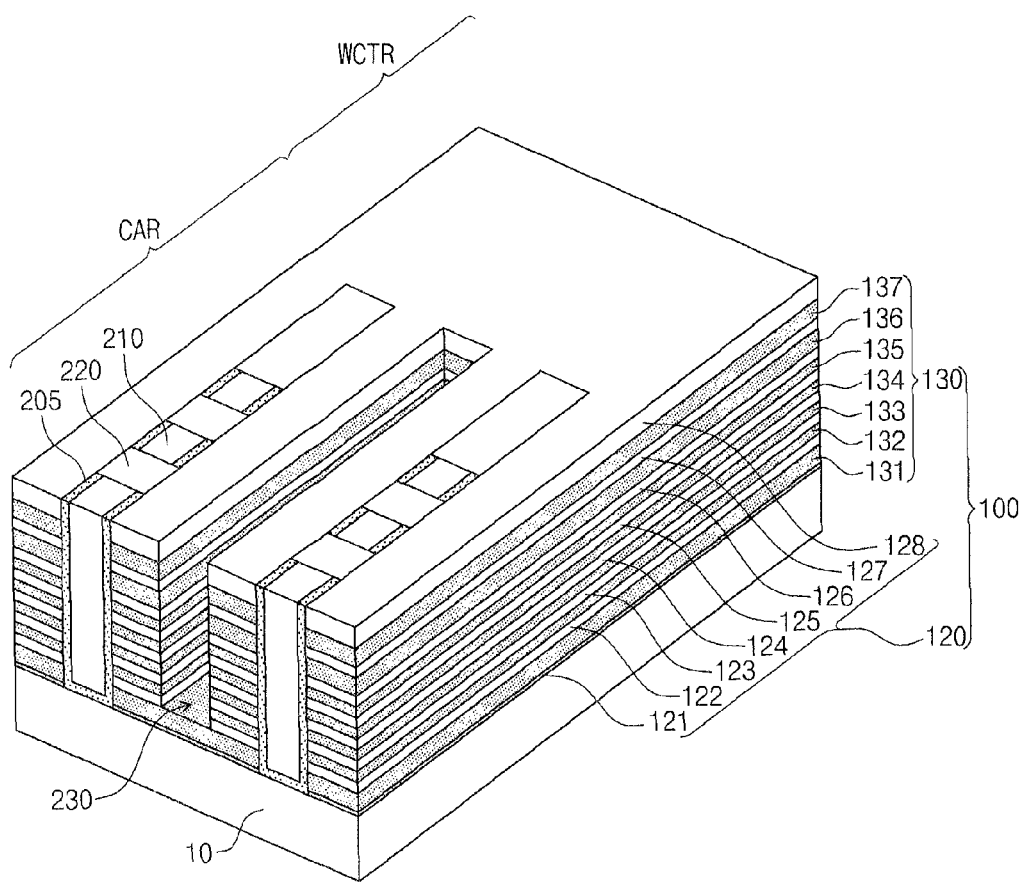

In detail, as shown in FIG. 7, the trenches 230 may be formed to be separated from the semiconductor patterns 205 and to expose sidewalls of the sacrificial layers 130 and the insulating layers 120. In plan view, the trenches 230 may be formed in a line shape or rectangular shape, and in cross-sectional view, the trenches 230 may be formed so as to expose at least a top surface of the lowermost layer of the sacrificial layers 130. In some embodiments, the conductive region (not shown), which may be used as a common source line, may be formed locally in the substrate 10 below the trenches 230. The conductive region may be formed through an ion implantation process, which uses the thin layer structure 100 having the trenches 230 as an ion implantation mask.

Figure 8:
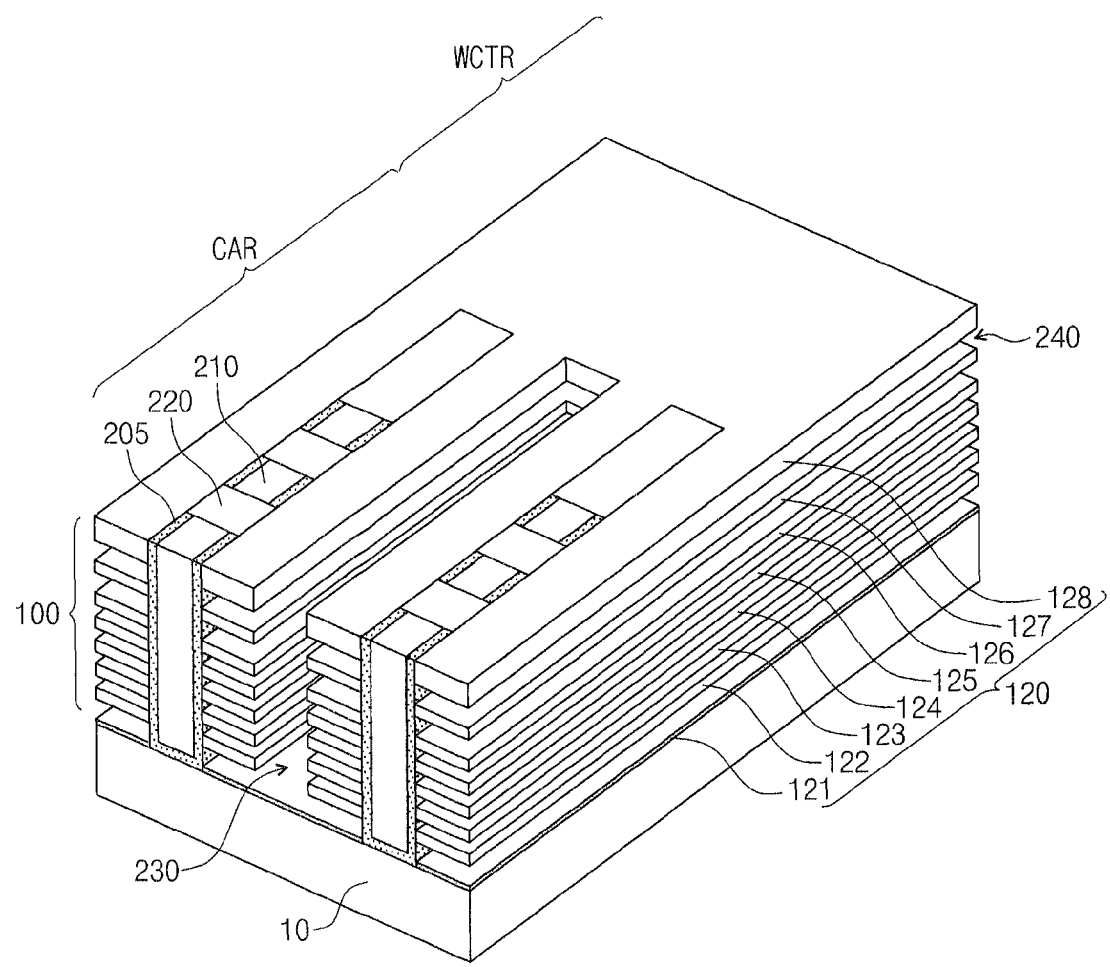
Figure 9:
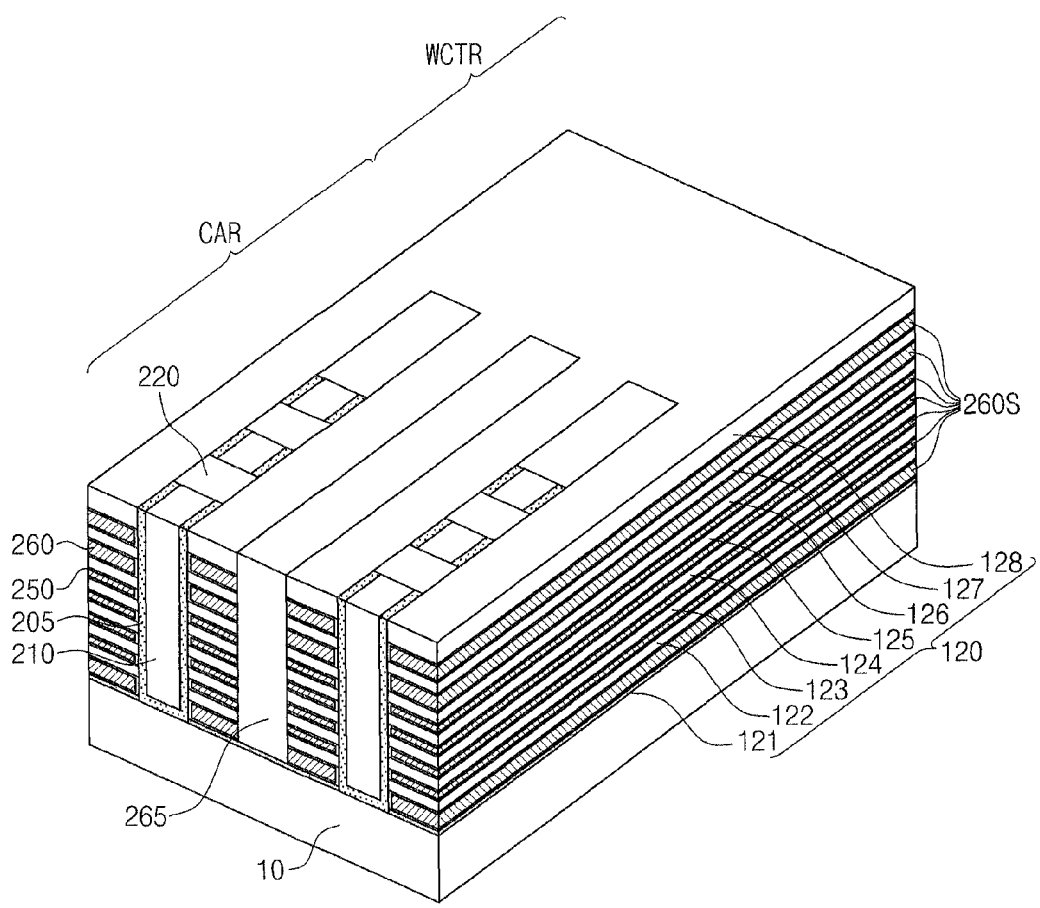

The replacing S32 may include selectively removing the sacrificial layers 130 of which sidewalls are exposed by the trenches 230 to form recess regions 240 between the insulating layers 120 as shown in FIG. 8, and forming an information storage layer 250 and a conductive pattern (e.g. horizontal electrode) 260 in each of the recess regions 240 as shown in FIG. 9.

The recess regions 240 may be gap regions horizontally extending between the insulating layers 120 from the trenches 230, and may be formed so as to expose the sidewalls of the semiconductor patterns 205. The forming of the recess regions 240 may include isotropically etching the sacrificial layers 130 by using an etch recipe having an etch selectivity with respect to the insulating layers 120. For example, if the sacrificial layers 130 are silicon nitrides and the insulating layers 120 are silicon oxides, the etching may be performed by using an etchant including, for example, phosphoric acid.

The forming of the information storage layer 250 and the conductive pattern 260 may include forming the information storage layer 250 and a conductive layer sequentially covering the trenches 230 and the recess regions 240, and removing the conductive layer in the trenches 230 to leave the conductive patterns 260 in the recess regions 240. Thereafter, as shown in FIG. 9, an electrode separating pattern 265 filling the trenches 230 may be additionally formed.

The information storage layer 250 may be formed by using a deposition technique (e.g., CVD or ALD) that can provide superior step coverage, and may be formed at a thickness less than half the thickness of the recess regions 240. Therefore, the information storage layer 250 may be formed so as to cover, in a substantially conformal manner, the resultant structure in which the recess regions 240 are formed. According to an embodiment of the inventive concept for a flash memory, the information storage layer 250 may include a charge storage layer. For example, the information storage layer 250 may include one or more insulating layers chosen from a trap insulating layer, a floating gate electrode, and conductive nano dots. According to an embodiment, the information storage layer 250 may further include a tunnel insulating layer and a blocking insulating layer. The tunnel insulating layer may include at least one of a silicon oxide layer and a silicon nitride layer, and the blocking insulating layer may include one or more layers chosen from an aluminum oxide layer, a silicon oxide layer and a silicon nitride layer.

The conductive layer may be formed so as to fill the recess regions 240 and the trenches 230, which are covered with the information storage layer 250. The conductive layer may include one or more layers chosen from a doped silicon layer, a tungsten layer, metal nitride layers and metal silicides. Meanwhile, since the technical spirit of the inventive concept is not limited to flash devices, the information storage layer 250 and the conductive layer may be modified variously in terms of material, structure and the like.

The removing of the conductive layer in the trench 230 may include anisotropically etching the conductive layer by using the uppermost insulating layer 120 constituting the thin layer structure 100 or a hard mask pattern (not shown) additionally formed on the uppermost insulating layer 120. If the conductive layer is removed in the trench 230, the conductive layer forms the conductive patterns 260 separated from each other in a vertical direction. The conductive patterns 260 may be formed locally in the recess regions 240 and may constitute a horizontal interconnection structure 260S.

The forming of the electrode separating pattern 265 may include filling the trench 230, from which the conductive layer is removed, with an insulating material. According to an embodiment, the electrode separating pattern 265 may include one or more layers chosen from a silicon oxide layer, a silicon nitride layer and a silicon oxynitride layer.

Referring to FIGS. 2 and 10 through 17, the horizontal interconnection structure 260S is patterned to form a stepwise contact structure 264 (FIG. 17) on the word line contact region WCTR (S4). In detail, this process S4 may include forming a mask structure 300S on the horizontal interconnection structure 260S (S41), forming a sacrificial mask pattern 310 (FIG. 12, for example) on the mask structure 300S (S42), and forming the stepwise contact structure 264 by patterning the horizontal interconnection structure 260S (S43).

The mask structure 300S may include a plurality of mask patterns formed in a direction crossing the trenches 230. The mask structure 300S may include first mask patterns 301 and second mask patterns 302 which are alternately and repeatedly arranged, and the first mask patterns 301 and the second mask patterns 302 may be formed of materials having an etch selectivity with respect to each other. For example, the first mask patterns 301 may be formed of a material chosen from silicon oxide, silicon nitride, silicon oxynitride, polycrystalline silicon, amorphous silicon, silicon carbide, metallic materials, and silicide materials, and the second mask patterns 302 may be formed of a material chosen from silicon oxide, silicon nitride, silicon oxynitride, polycrystalline silicon, amorphous silicon, silicon carbide, metallic materials, and silicide materials and is different from the material constituting the first mask pattern 301.

According to an embodiment, the second mask patterns 302 may be formed of polycrystalline silicon having a conductive type which is different from that of the semiconductor patterns 205, and the first mask patterns 301 may be formed by patterning the uppermost layer (e.g., 128) of the insulating layers 120 constituting the thin layer structure 100. According to another embodiment, the first and second mask patterns 301 302 may be formed at different heights, unlike shown in the figures. For example, the second mask patterns 302 may be formed on the insulating layer 120 used as the first mask patterns 301.

Figure 10:
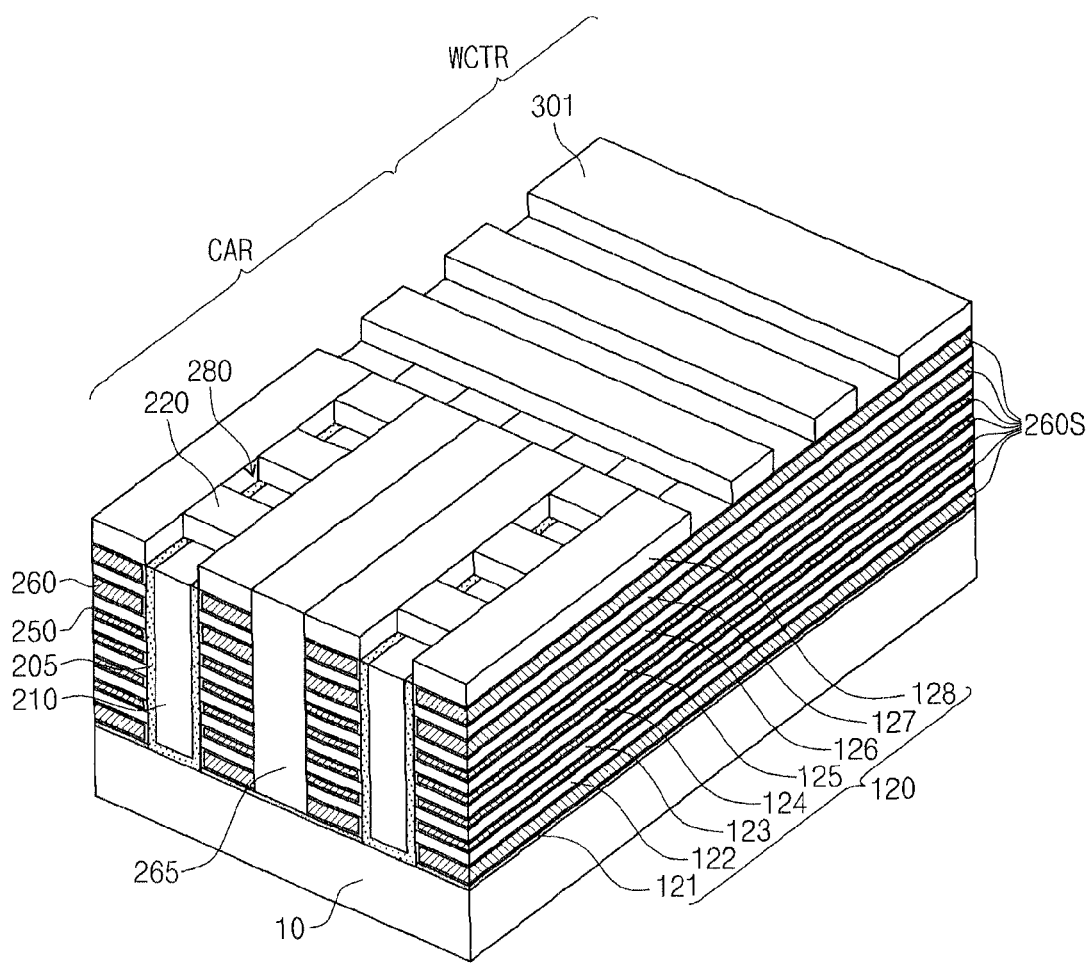
Figure 11:
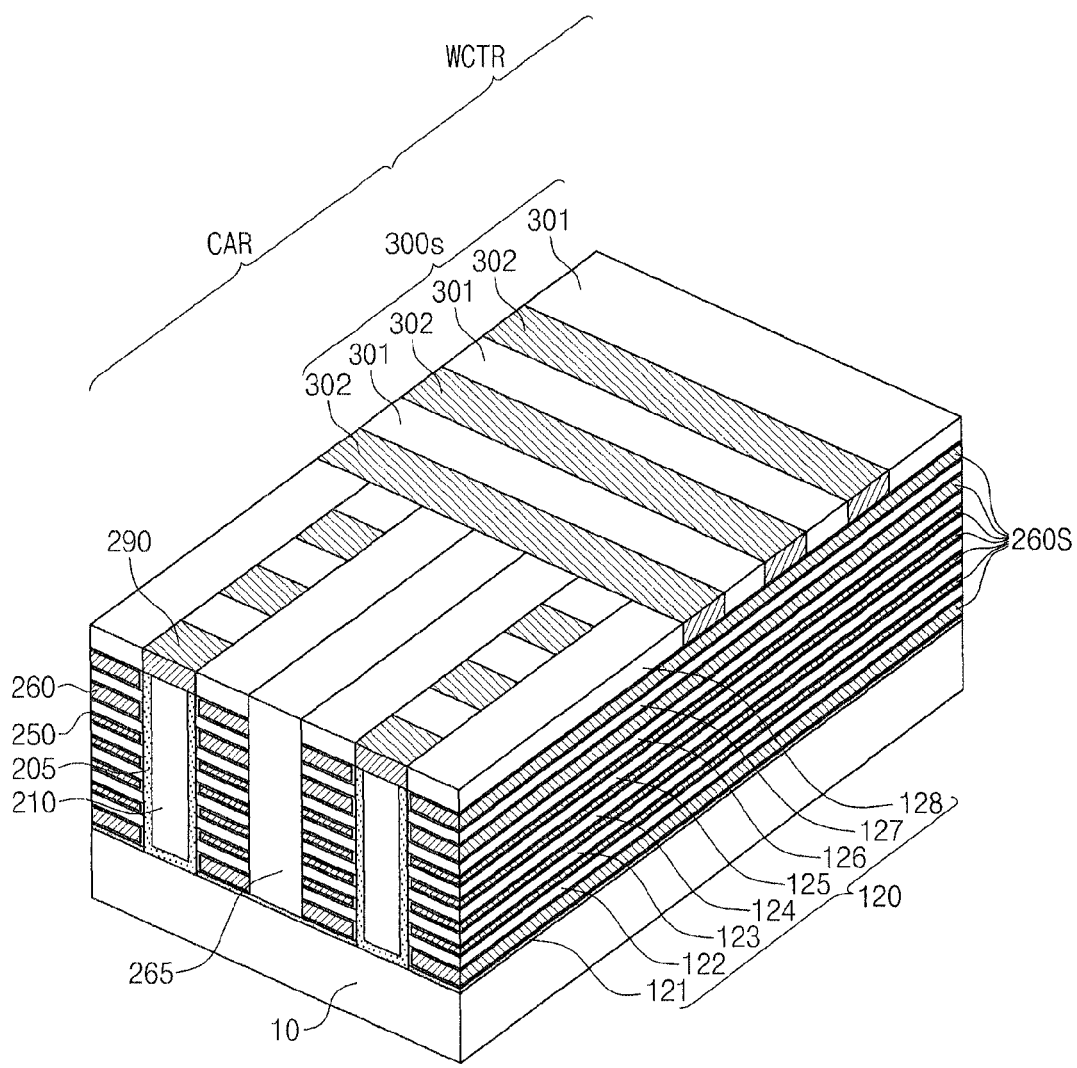
Figure 12:
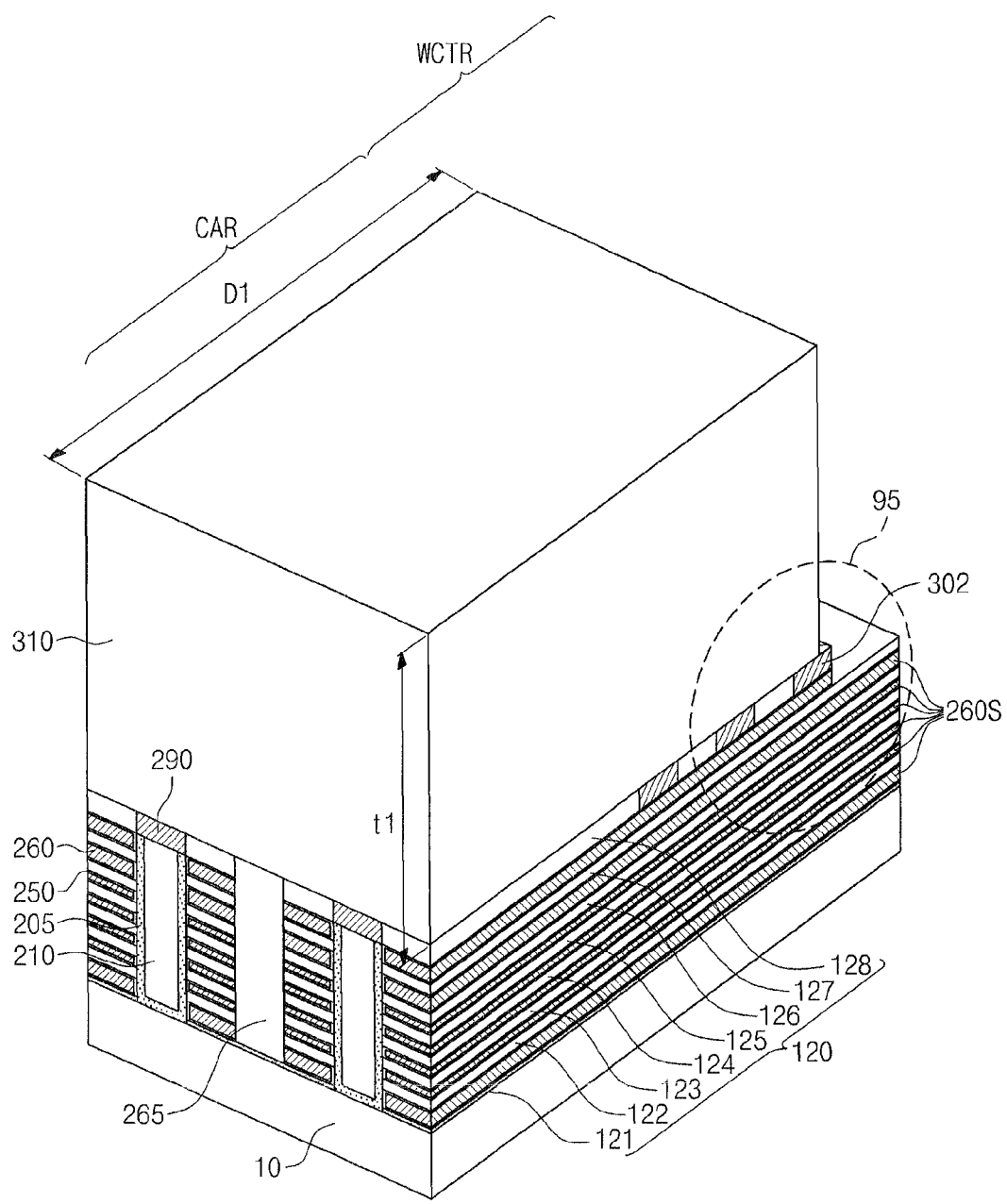
Figure 13:
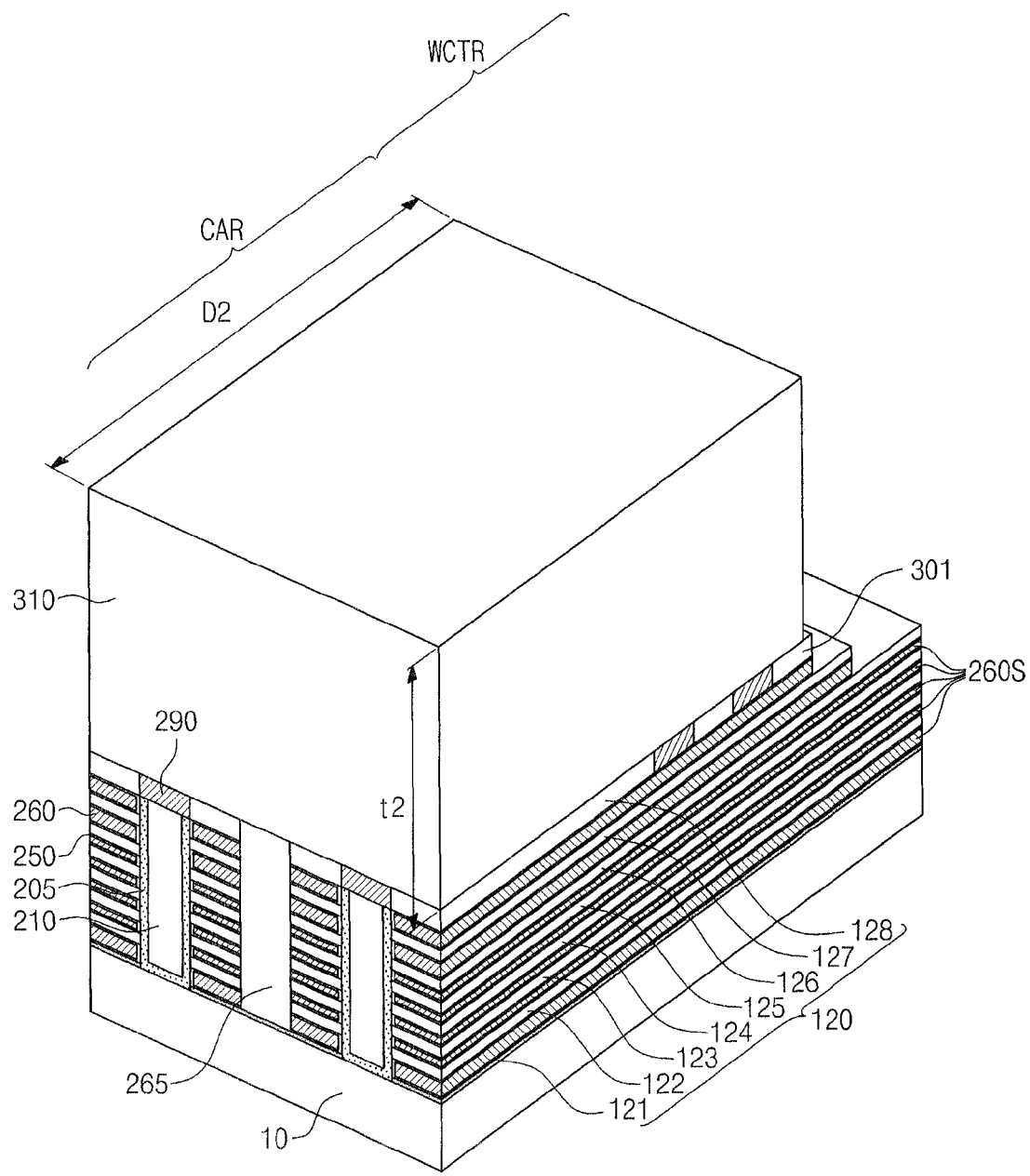
Figure 14:
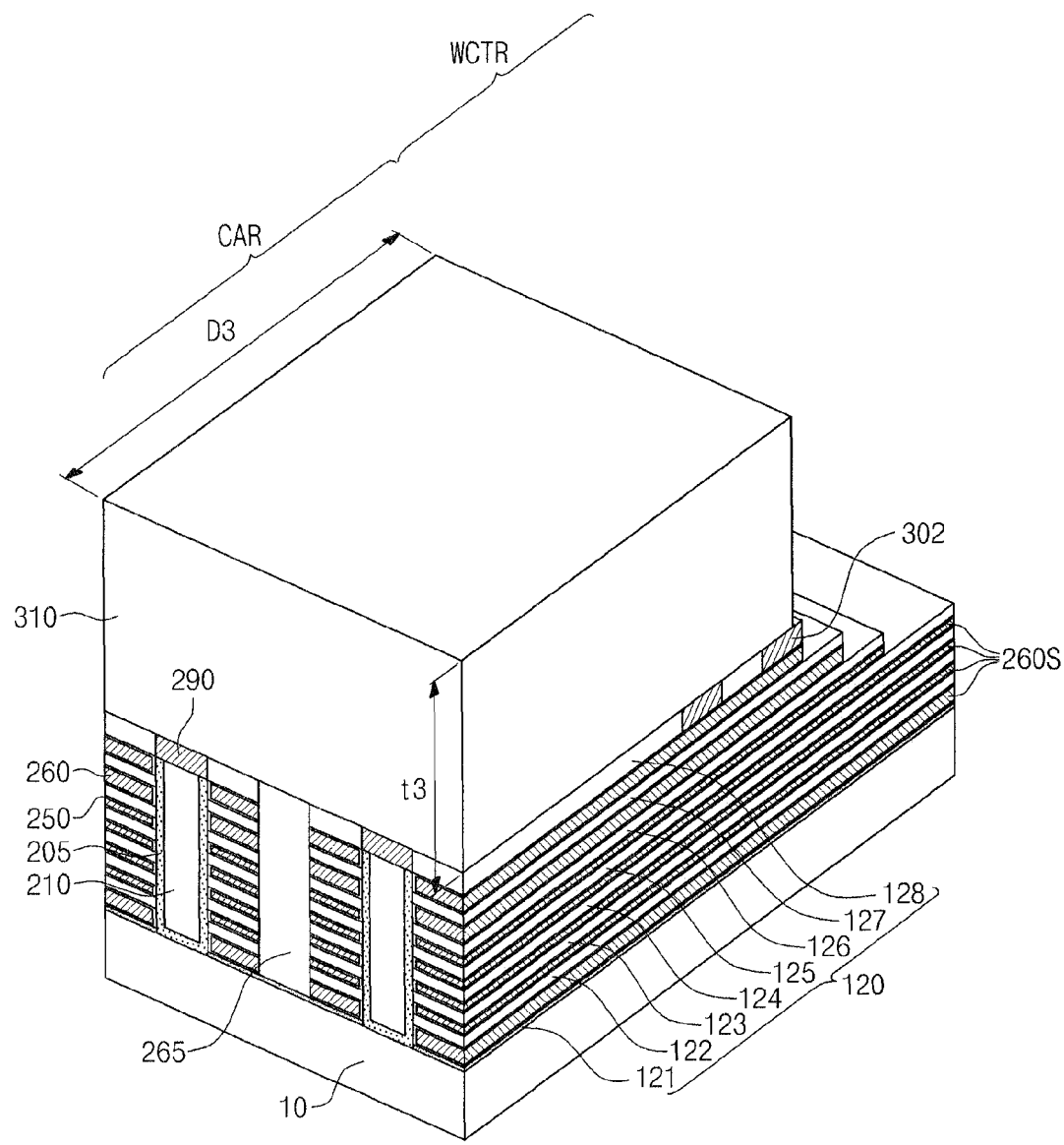
Figure 15:
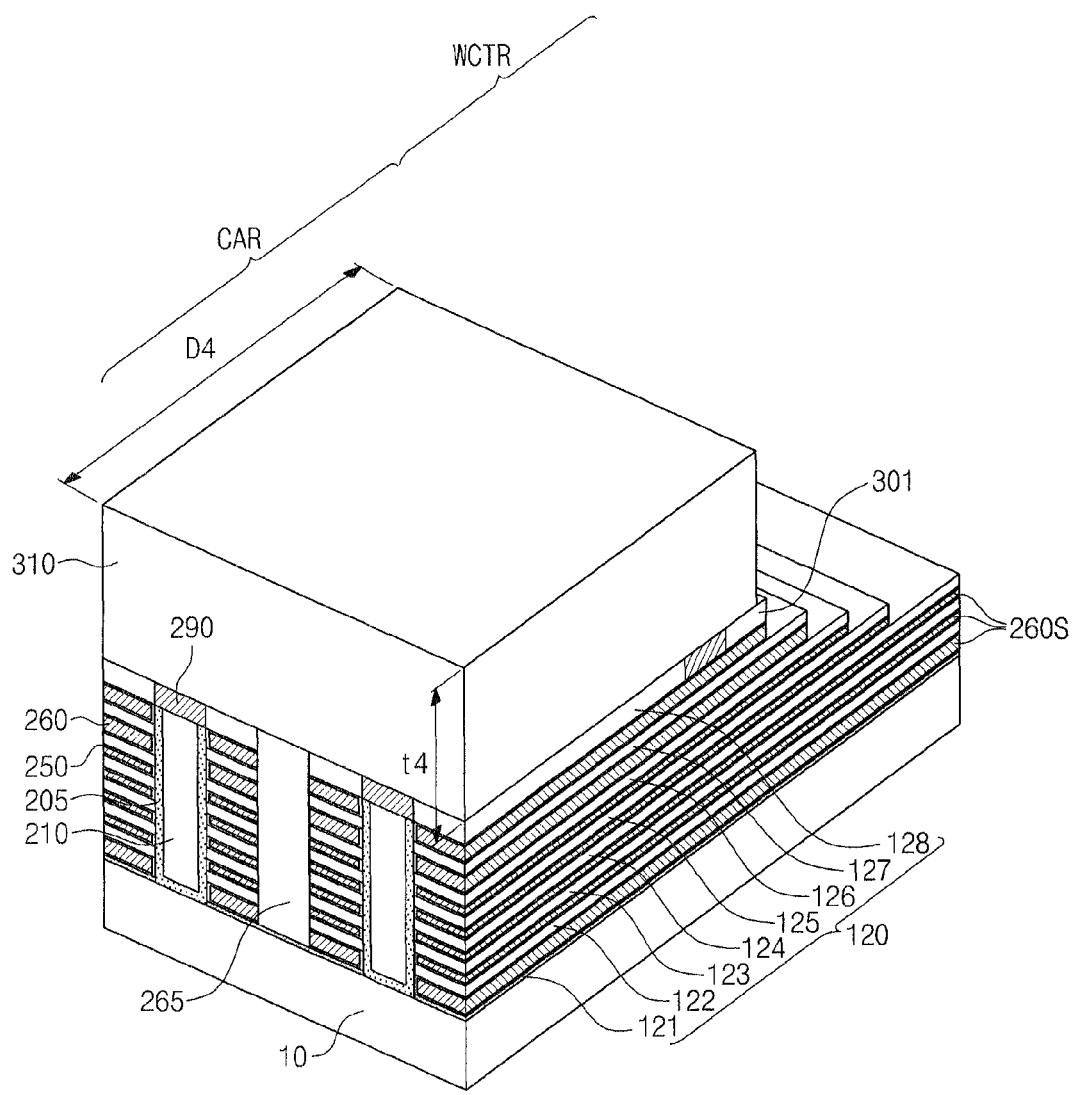
Figure 16:
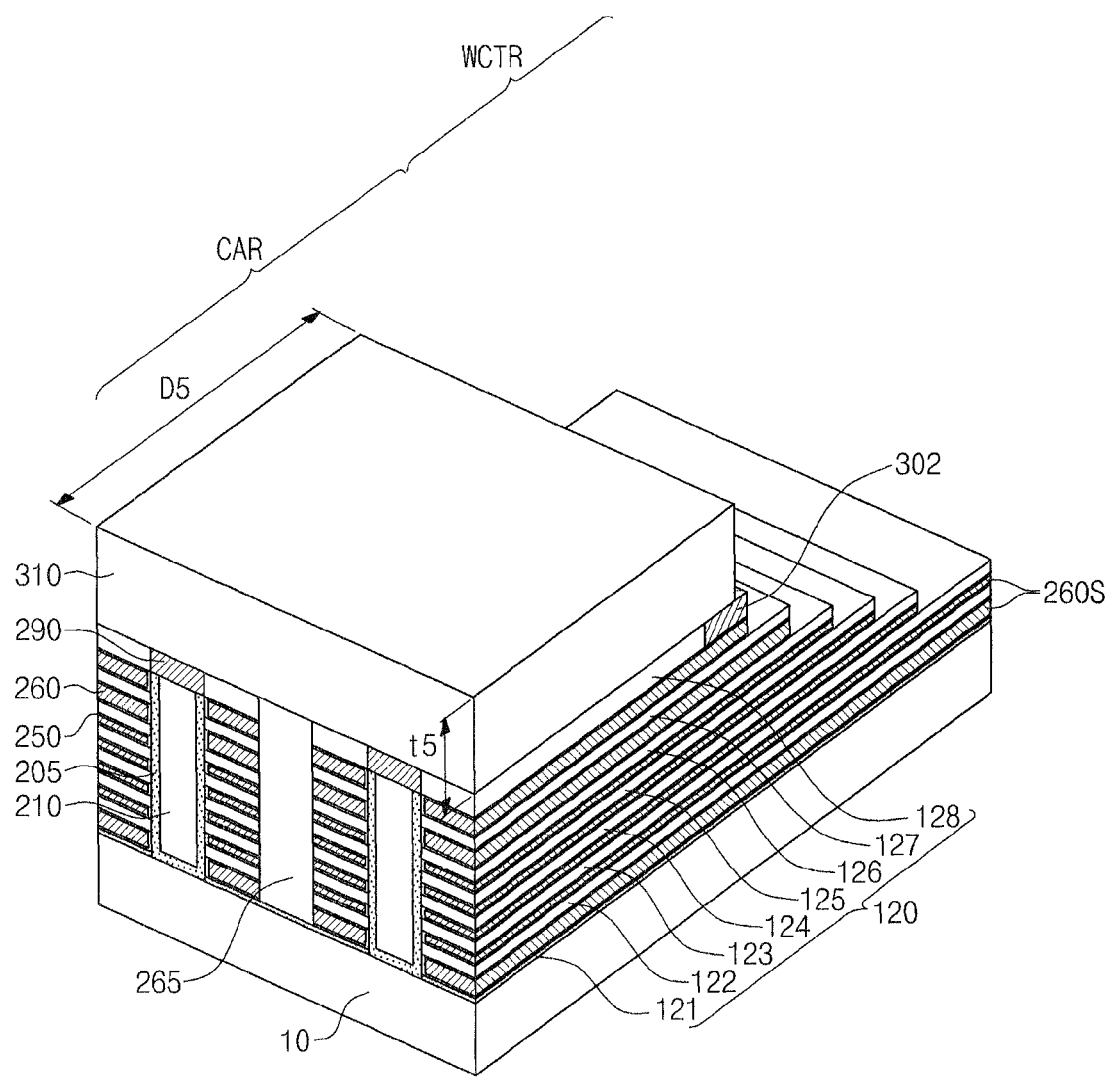
Figure 17:
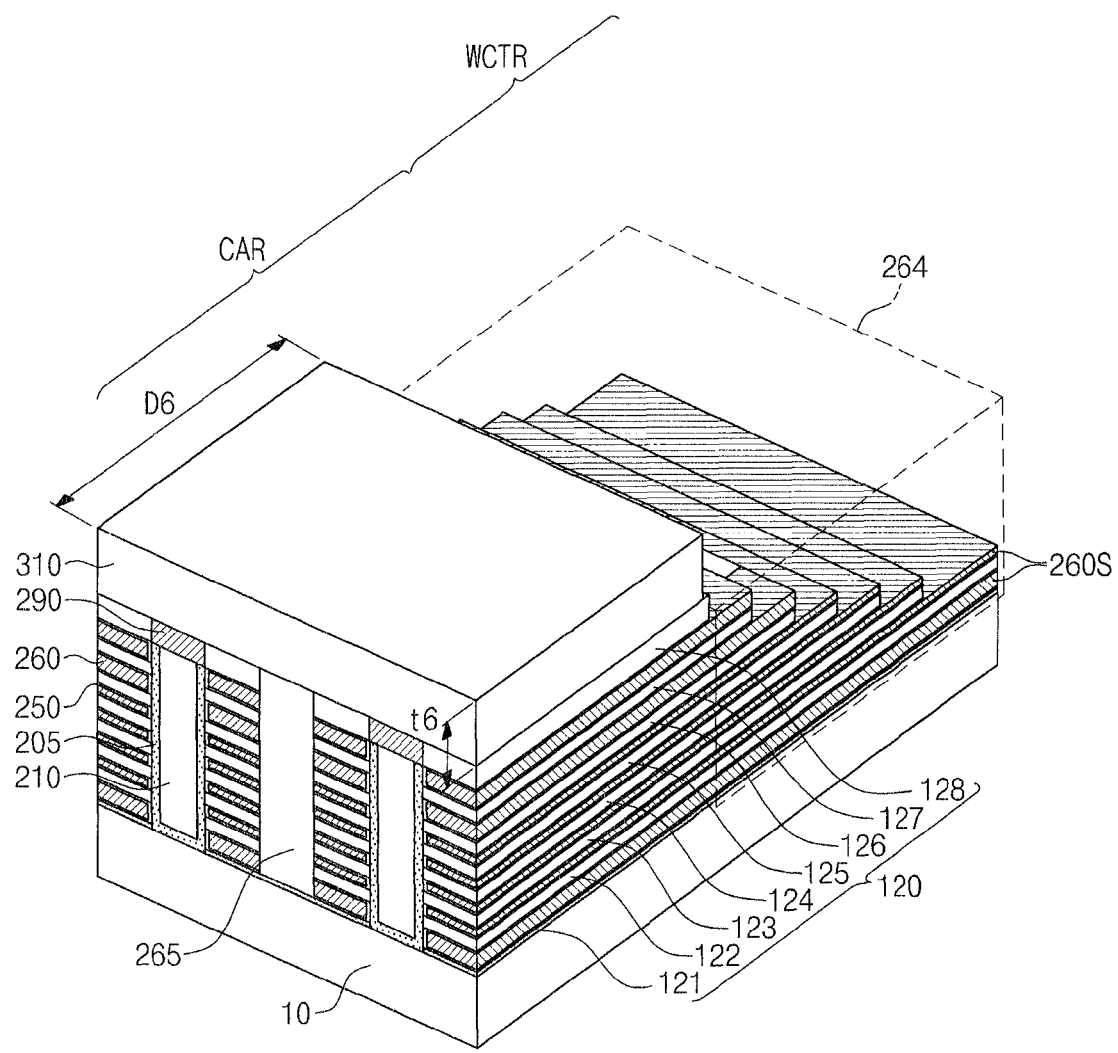

The forming S41 of the mask structure 300S may include forming the first mask patterns 301 crossing the trenches 230 by patterning a portion of the insulating layer 120 constituting the thin layer structure 100 as shown in FIG. 10, and forming the second mask patterns 302 between the first mask patterns 301 as shown in FIG. 11.

According to some embodiments, as shown in FIG. 10, upper regions of the first buried pattern 210 and a portion of the semiconductor pattern 205 may be etched together while forming the first mask patterns 301. In this case, grooves 280 having top surfaces having a height lower than a top surface of the first mask pattern 301 may be formed at the upper portions of the semiconductor patterns 205. While the second mask patterns 302 are formed, the grooves 280 may be filled with the same material as the second mask patterns 302. According to this embodiment, the second mask pattern 302 may include a polycrystalline silicon layer having a conductive type different from that of the semiconductor pattern 205.

The sacrificial mask pattern 310 may be formed of one or more materials having an etch selectivity with respect to materials constituting the mask structure 300S, the insulating layers 120 and the horizontal interconnection structure 260S. According to an embodiment, the sacrificial mask pattern 310 may be formed by one or more photoresist materials or one or more organic materials. Also, a thickness of the sacrificial mask pattern 310 may be greater than a width of the stepwise contact structure.

The patterning S43 of the horizontal interconnection structure 260S may include a consumable etch process, which uses the mask structure 300S and the sacrificial mask pattern 310 as a consumable etch mask as shown in FIGS. 12 through 17. In detail, the consumable etch process may include a plurality of sub-patterning processes, and each of the plurality of sub-patterning processes shown in FIGS. 12 through 17 may include a horizontal etch process and a vertical etch process.

The horizontal etch process may be performed so as to gradually reduce an area occupied by the mask structure 300S and the sacrificial mask pattern 310, and may include a first horizontal etch process horizontally etching a sidewall of the sacrificial mask pattern 310, and a second horizontal etch process selectively removing at least one of mask patterns constituting the mask structure 300S. The first horizontal etch process may expose a top surface of at least one of the mask patterns 301, 302 covered by the sacrificial mask pattern 310 in the previous sub-patterning process by horizontally extending a region exposed by the sacrificial mask pattern 310. The second horizontal etch process may include selectively removing at least one of the mask patterns 301, 302 newly exposed through the first horizontal etch process. An area of the insulating layers 120 and the horizontal interconnection structure 260S exposed as the mask patterns 301, 302 are removed may extend as the sub-patterning processes are repeatedly performed.

The first horizontal etch process may be performed by using an isotropic dry etch process or a wet etch process. Also, the first horizontal etch process may be performed by using a blanket etch process, so that a sidewall and an upper surface of the sacrificial mask pattern 310 may be etched together. Therefore, as shown in FIGS. 12 through 17, width and thickness of the sacrificial mask pattern 310 may be reduced as the sub-patterning processes are repeatedly performed (i.e., D1>D2>D3>D4>D5>D6 and t1>t2>t3>t4>t5>t6).

The number of the mask patterns 301, 302 removed in the horizontal etch process may be one or two. If the number of the mask patterns removed is one, one of the first mask patterns 301 may be removed after the odd sub-patterning process, and one of the second mask patterns 302 may be removed after the even sub-patterning process. That is, the second horizontal etch processes of the odd sub-patterning processes may use an etch recipe that can selectively remove the first mask pattern 301, and the second horizontal etch processes of the even sub-patterning processes may use an etch recipe that can selectively remove the second mask pattern 302.

The vertical etch process may include etching the horizontal interconnection structure 260S and the insulating layers 120 by using the sacrificial mask pattern 310 and the mask patterns 301, 302 as etch masks. In the vertical etch process along a vertical direction, the sub-patterning process may be performed so as to remove one of the conductive patterns 260 and one of the insulating layers 120. Also, in the vertical etch process along a horizontal direction, regions of the horizontal interconnection structure 260S and the insulating layers 120 etched in the vertical etch process may be below the mask patterns 301, 302 removed through the corresponding sub-patterning process and the sub-patterning process performed previously to the corresponding sub-patterning process. That is, the horizontal interconnection structure 260S and the insulating layer 120, which are patterned in a previous sub-patterning process, may be additionally patterned during a predetermined sub-patterning process.

Therefore, the cumulative number of the sub-patterning processes performed with respect to the horizontal interconnection structure 260S may vary according to a distance from the cell array region CAR or the semiconductor patterns 205. According to a difference in the cumulative number of the sub-patterning processes, as shown in FIGS. 12 through 17, the horizontal interconnection structure 260S may be formed so as to have a stepwise contact structure 264 in the word line contact region WCTR.

Figure 18:
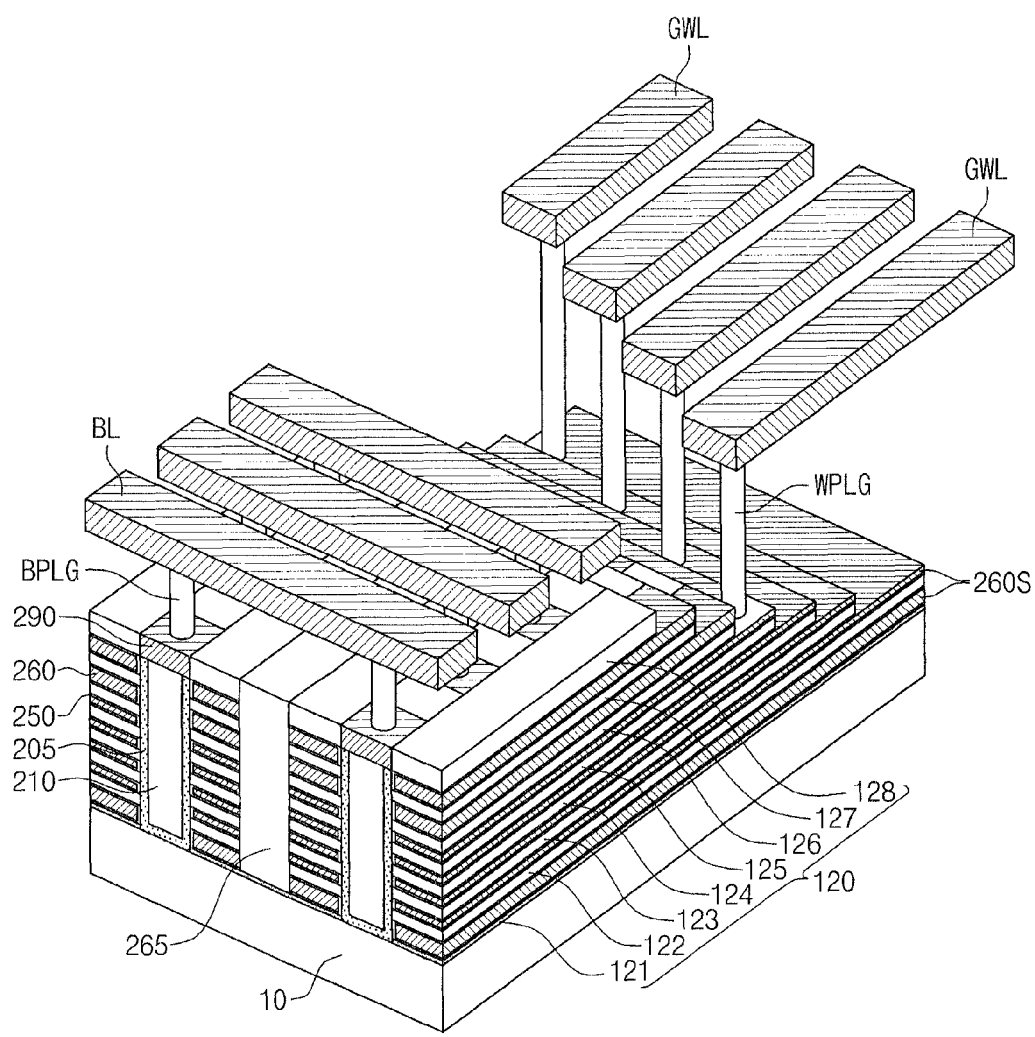
Figure 19:
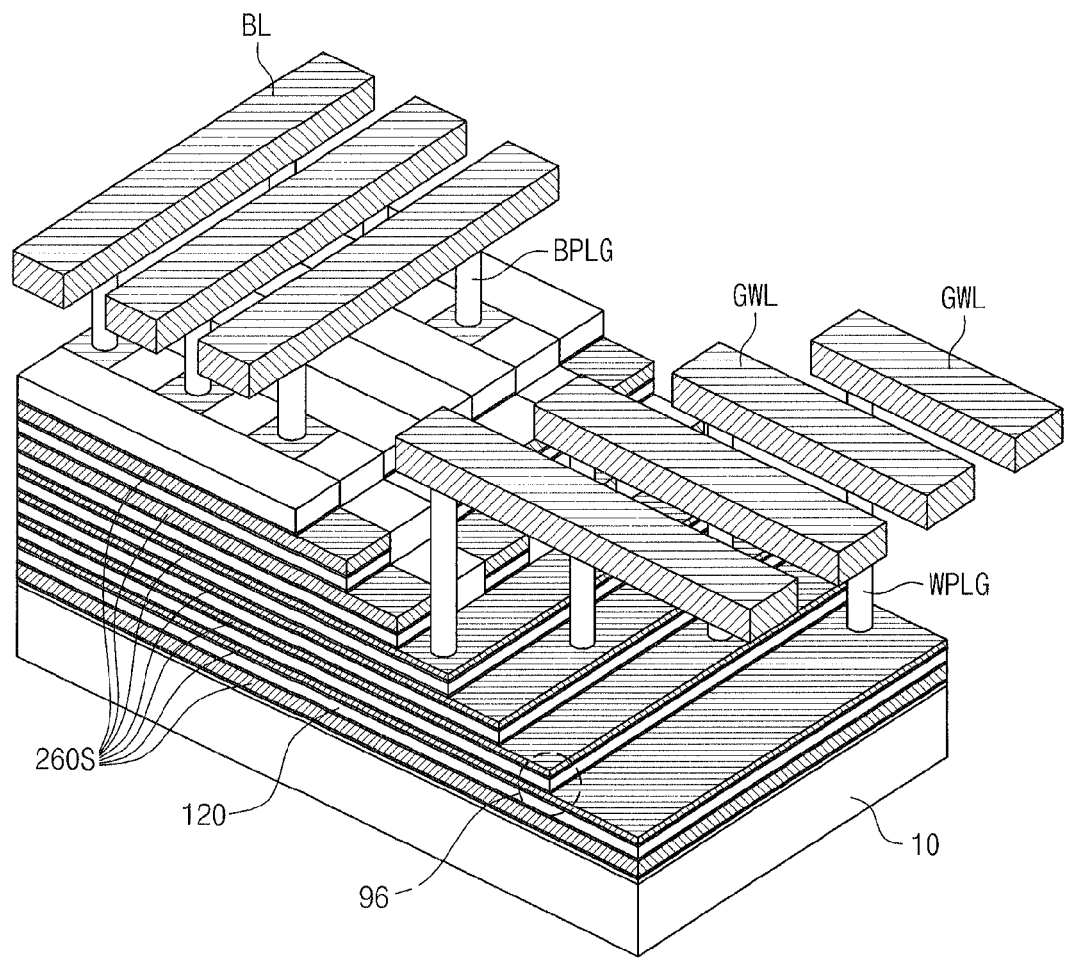
FIG. 19 is a perspective view of a three dimensional semiconductor device viewed in a different direction from FIG. 18.

Referring to FIGS. 2, 18 and 19, after the sacrificial mask pattern 310 is removed, word line plugs WPLG connected with the horizontal interconnection structure 260S and global word lines GWL connected with the word line plugs WPLG are formed (S5). As aforementioned, since the horizontal interconnection structure 260S is formed so as to have a stepwise contact structure 264 in the word line contact region WCTR, the conductive patterns 260 formed at different heights may be respectively connected with the word lines plugs WPLG, which are formed at the same time by using the same or similar process.

On the other hand, bit line plugs BPLG connected with the semiconductor patterns 205 and bit lines BL connecting the bit line plugs BPLG may be additionally formed. The bit lines BL may be formed in a direction crossing the trench 230 or the conductive patterns 260 as shown in the figures. According to an embodiment, the bit line plug BPLG may be formed by using the process of forming the word line plug WPLG. Similarly, the bit line BL may be formed by using the process of forming the global word line GWL.

According to the present embodiment, the stacked conductive patterns 260 may be used as a string select line SSL, a ground select line GSL and word lines WL. For example, the uppermost layer and the lowermost layer of the conductive patterns 260 may be used as a string select line SSL and a ground select line GSL, respectively, and the conductive patterns 260 between the uppermost layer and the lowermost layer may be used as word lines. Alternatively, as shown in FIGS. 18 and 19, the two uppermost layers of conductive patterns 260 may be used as the string select line SSL. The conductive patterns 260 used as the string select line SSL may be horizontally separated. In this case, two or more string select lines SSL electrically separated from each other may be disposed at substantially the same height. Alternatively, word lines included in a single block may be connected with each other in the word line contact region WCTR to have a comb-shape or a finger-shape.

Figure 20:
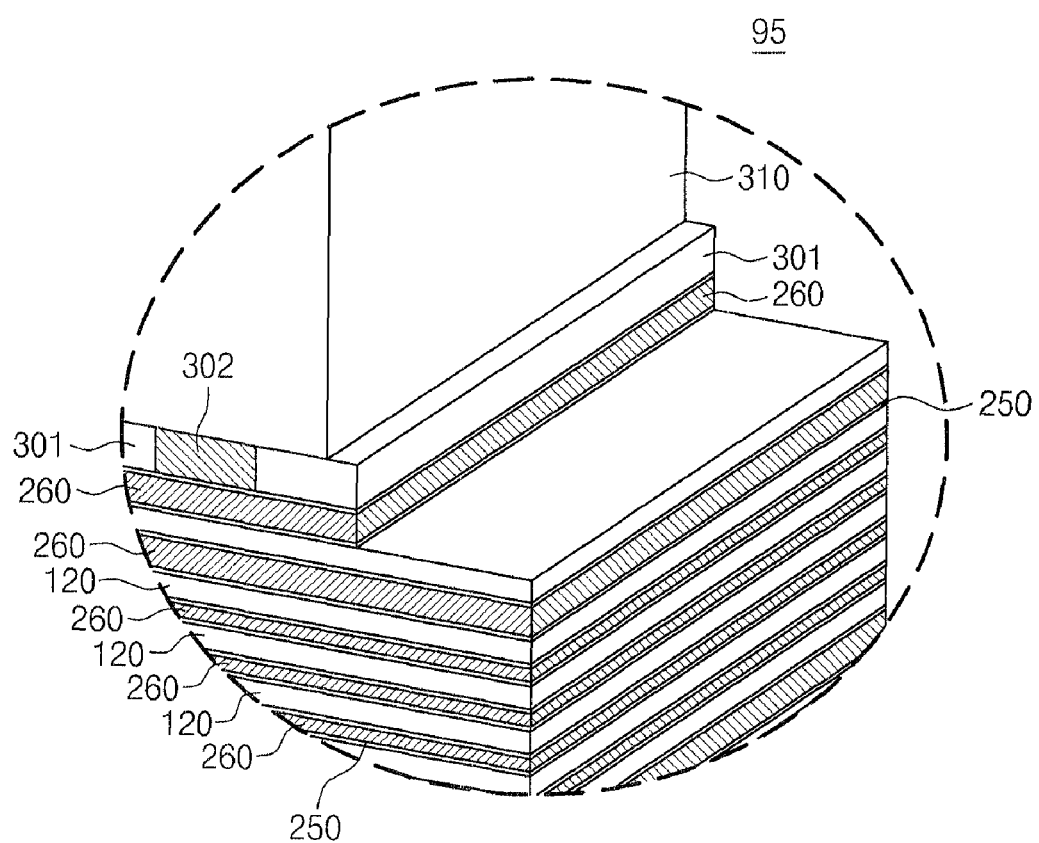
FIGS. 20 and 21 are detailed views for describing a modification of the first embodiment according to the technical spirit of the inventive concept.
Figure 21:
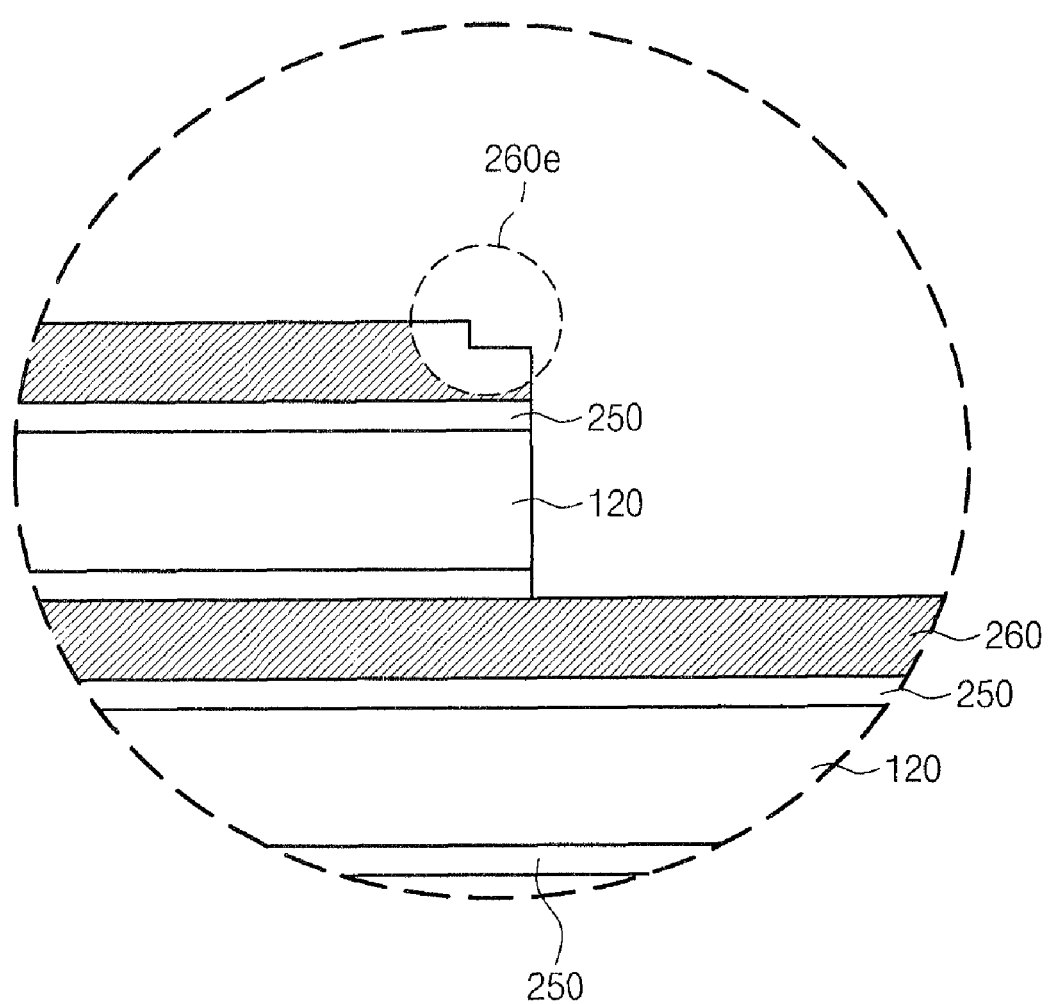

FIGS. 20 and 21 are detailed views for describing a modification of the first embodiment according to the technical spirit of the inventive concept. Specifically, FIG. 20 is a detailed view of region 95 of FIG. 12 as viewed from a different direction, and FIG. 21 is a detailed view of region 96 of FIG. 19.

As shown in FIG. 20, a sidewall of the sacrificial mask pattern 310 may be spaced apart from sidewalls of the underlying mask patterns 301, 302. That is, while the sub-patterning processes are performed, the sidewall of the sacrificial mask pattern 310 is not aligned with the sidewalls of the mask patterns 301, 302, so that top edge surfaces of the mask patterns 301, 302 may be partially exposed. In this case, while the horizontal etch process and the vertical etch process constituting the sub-patterning processes are performed, the exposed top edge surfaces of the mask patterns 301, 302 may be recessed downwardly, and the recessed regions of the mask patterns 301, 302 may be reflected in the conductive pattern 260 in a subsequent sub-patterning process. As a result, the conductive pattern 260 may include two portions having different thicknesses respectively and connected to each other in the word line contact region WCTR as shown in FIG. 21. That is, at least one edge 260e of the conductive patterns 260 may be formed in a stepwise structure.

Figure 22:
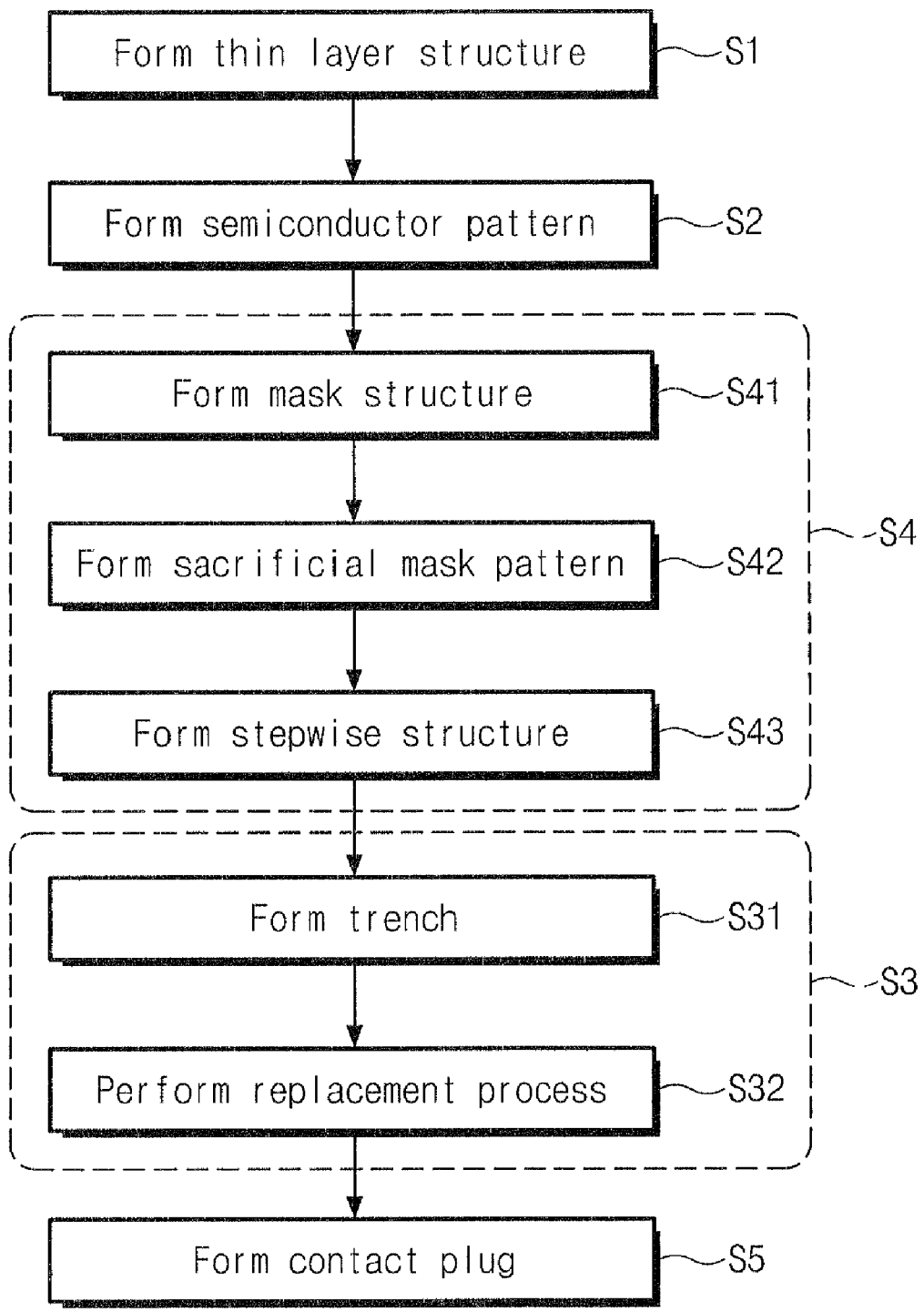
FIG. 22 a flow diagram for describing a method of fabricating a three dimensional semiconductor device according to a second embodiment based on the technical spirit of the inventive concept.

FIG. 22 is a flow diagram for describing a method of fabricating a three dimensional semiconductor device according to a second embodiment based on the technical spirit of the inventive concept. FIGS. 23 through 30 are perspective views for describing a method of fabricating a three dimensional semiconductor device according to a second embodiment based on the technical spirit of the inventive concept. For simplicity of description, description on technical features overlapping those of the foregoing first embodiment may be omitted.

Comparing FIGS. 2 and 22, the fabricating method according to the second embodiment has a difference in the process flow from that according to the first embodiment. In detail, a series of process operations S3 for forming the horizontal interconnection structure 260S may be performed after a series of process operations S4 for forming a stepwise structure.

Figure 23:
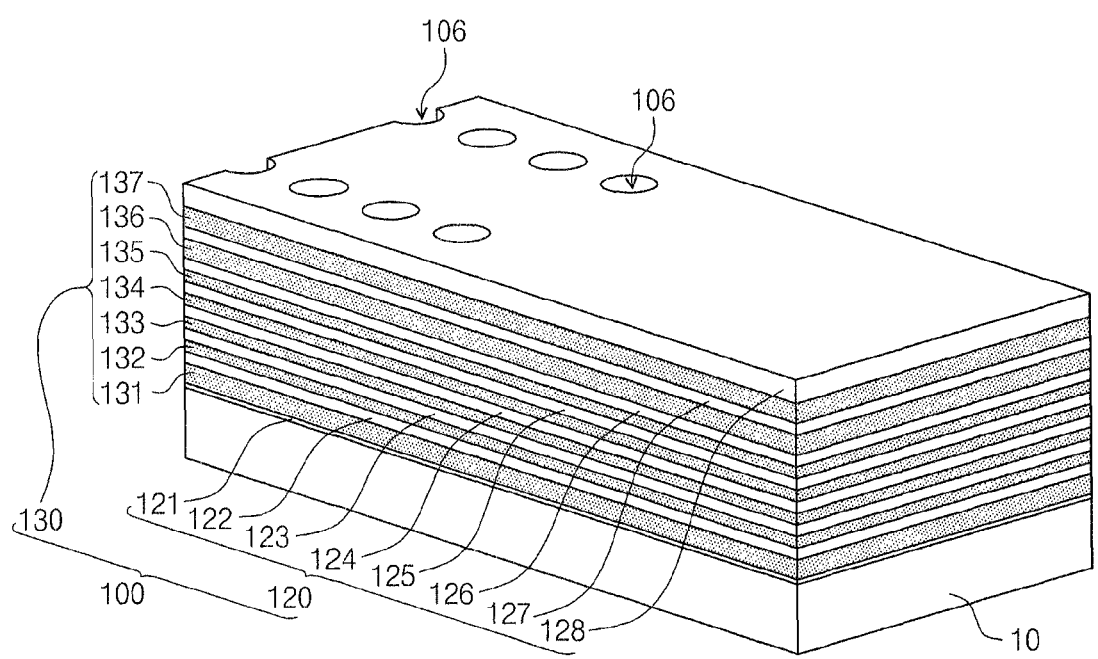
FIGS. 23 through 30 are perspective views for describing a method of fabricating a three dimensional semiconductor device according to a second embodiment based on the technical spirit of the inventive concept.
Figure 24:
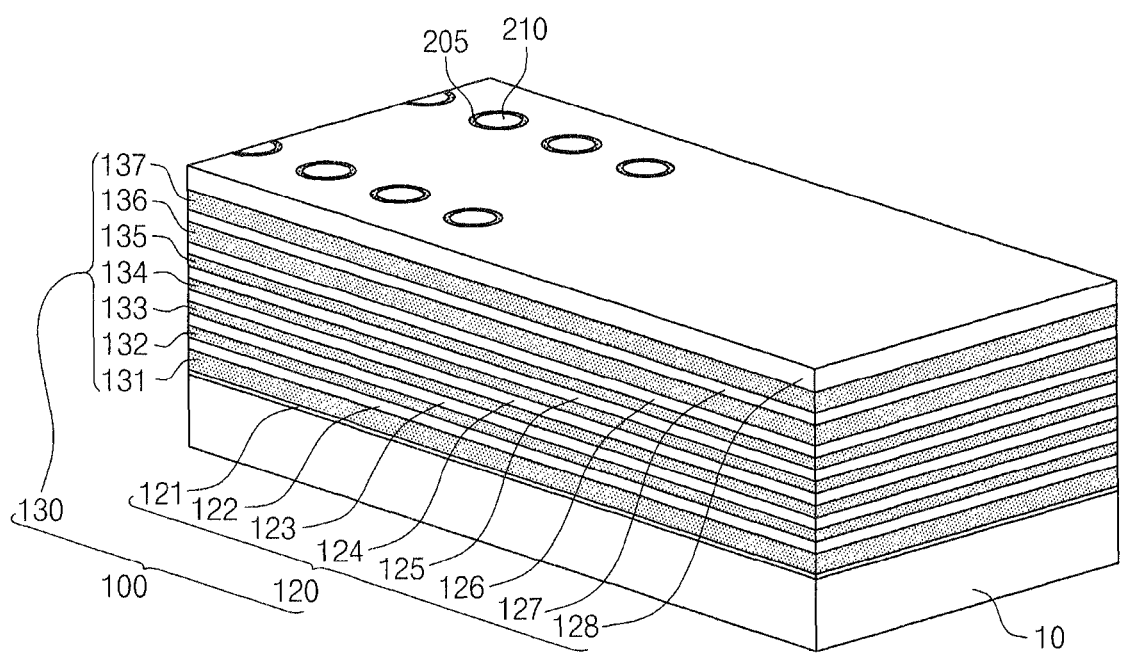

Referring to FIGS. 22 through 24, a thin layer structure 100 is formed (S1), and semiconductor patterns 205 penetrating the thin layer structure 100 are formed (S2). The thin layer structure 100 may include a plurality of insulating layers 121-128 (120) and a plurality of sacrificial layers 131-137 (130), and may be formed identically as that of the first embodiment described with reference to FIG. 3.

The forming S2 of the semiconductor patterns 205 may include forming penetrating holes 106 penetrating the thin layer structure 100 as shown in FIG. 23, and then forming semiconductor patterns 205 and first buried patterns 210 sequentially filling the penetrating holes 106 as shown in FIG. 24. As shown in FIG. 23, the penetrating holes 106 of the present embodiment may be formed not in a line shape shown in FIG. 4 but in a hole shape. The semiconductor patterns 205 and the first buried patterns 210 may be formed by a damascene process which uses the penetrating holes 106 as a mold. Therefore, the semiconductor patterns 205 according to the present embodiment may have a substantially cylindrical shape or cup shape whose bottom surface is closed. Materials for the semiconductor patterns 205 and the first buried patterns 210 may be the same as those in the first embodiment.

Figure 25:
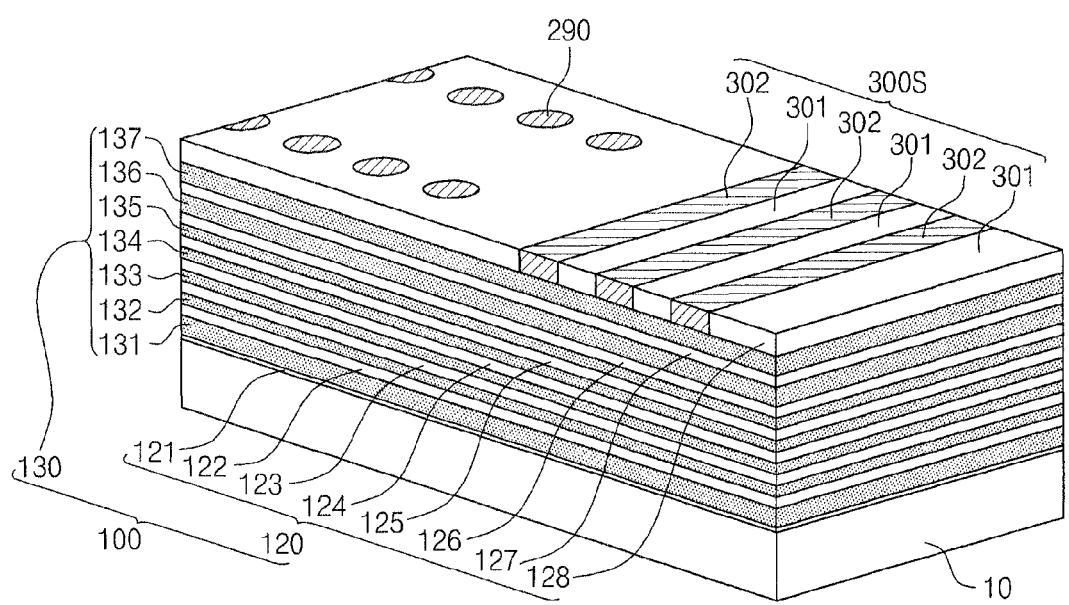

Referring to FIGS. 22 and 25, a mask structure 300S is formed on the thin layer structure 100 (S41). In the case of the first embodiment, the mask structure 300S is formed on the resultant structure in which the horizontal interconnection structure 260S is formed, but in the case of the present embodiment, the mask structure 300S is formed on the thin layer structure 100 including the sacrificial layers 130.

The mask structure 300S may include a plurality of mask patterns 301, 302 formed in a direction perpendicular to the later-formed trenches 230 (see FIG. 29). The mask patterns 301 302 may include first mask patterns 301 and second mask patterns 302 which are alternately and repeatedly arranged, and the first mask patterns 301 and second mask patterns 302 may be formed of materials having an etch selectivity with respect to each other. For example, the first mask patterns 301 may be formed of a material chosen from silicon oxide, silicon nitride, silicon oxynitride, polycrystalline silicon, amorphous silicon, silicon carbide, metallic materials, and silicide materials, and the second mask patterns 302 may be formed of a material chosen from silicon oxide, silicon nitride, silicon oxynitride, polycrystalline silicon, amorphous silicon, silicon carbide, metallic materials, and silicide materials and is different from the material constituting the first mask pattern 301.

The mask structure 300S according to the present embodiment may be formed in the same structure as that according to the first embodiment. However, since the present embodiment may have a difference in process flow from the foregoing embodiment, materials etched in the consumable etch process S43, which uses the mask structure 300S as an etch mask, may be different in the two embodiments. That is, in the case of the first embodiment, the consumable etch process may include etching the conductive patterns 260, but in the case of the second embodiment, the consumable etch process may include etching the sacrificial layers 130 constituting the thin layer structure 100 as will be described with reference to FIGS. 26 and 27. Thus, since an etch target material in the consumable etch process S43 of the second embodiment is different from that in the consumable etch process S43 of the first embodiment, materials constituting the first mask patterns 301 and second mask patterns 302 may be modified from those of the first embodiment. However, it will be apparent to those skilled in the art that optimal materials for providing the first mask patterns 301 and second mask patterns 302 may be selected without undue experimentation. Therefore, a more detailed description with respect to the modification of materials will be omitted. Also, the kinds of materials for the first mask patterns 301 and second masks patterns 302 are not, however, limited to the foregoing exemplified materials.

Figure 26:
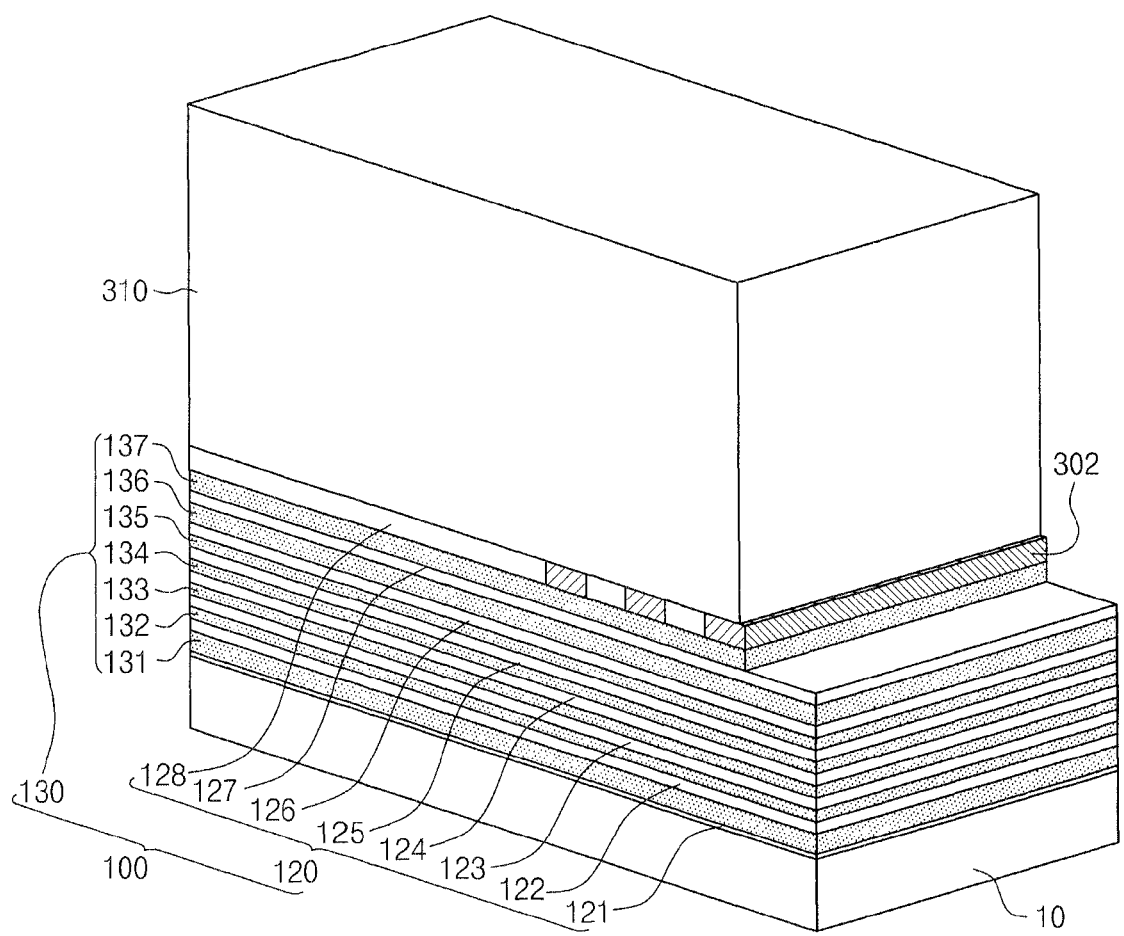
Figure 27:
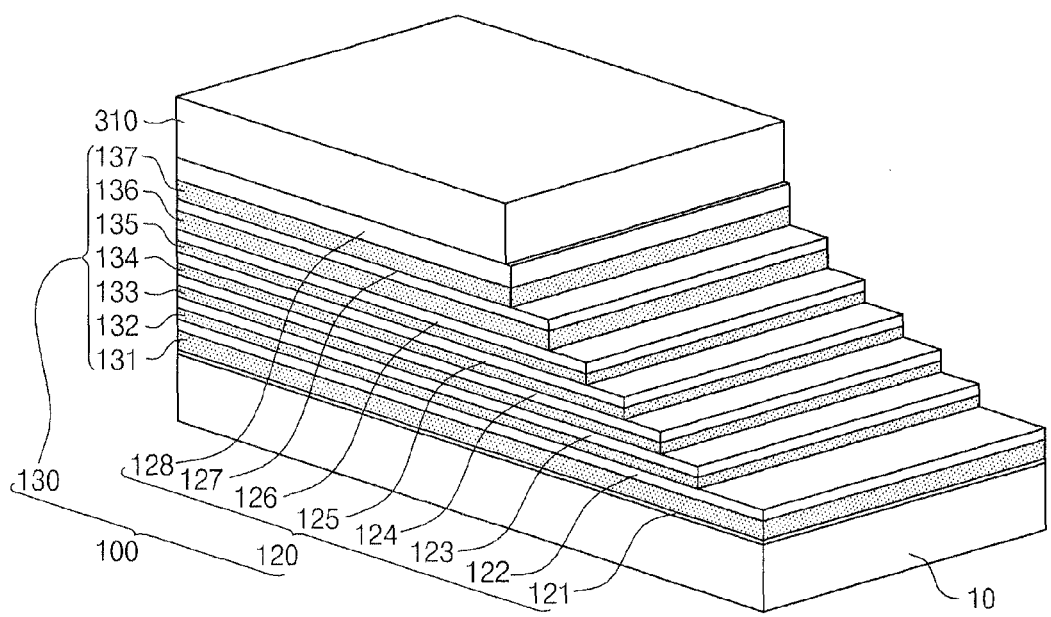

Referring to FIGS. 23, 26 and 27, a sacrificial mask pattern 310 is formed on the mask structure 300S (S42), and then a consumable etch process S43, which uses the mask structure 300S and the sacrificial pattern 310 as a consumable etch mask, is performed. The consumable etch process S43 may include a plurality of sub-patterning processes, and each of the sub-patterning processes may include a horizontal etch process and a vertical etch process. The sacrificial mask pattern 310 may be formed by using the same method and materials as that of the foregoing first embodiment.

The horizontal etch process may be performed so as to gradually reduce an area occupied by the mask structure 300S and the sacrificial mask pattern 310, and may include a first horizontal etch process horizontally etching a sidewall of the sacrificial mask pattern 310, and a second horizontal etch process selectively removing at least one of mask patterns constituting the mask structure 300S, similarly with the foregoing first embodiment. As aforementioned, materials for the first mask patterns 301 and second mask patterns 302 according to the present embodiment may be different from those according to the first embodiment. Due to this difference, the first second horizontal etch process of the present embodiment may be different from that of the first embodiment. However, it will be understood to those skilled in the art that an optimal solution for the second horizontal etch process may be obtained without undue experimentation. Therefore, description on modification from the first embodiment of the second horizontal each process that may be caused by a difference in material type will be omitted.

The vertical etch process may include etching the insulating layers 120 and the sacrificial layers 130 by using the sacrificial mask pattern 310 and the mask patterns 302 as etch masks. In the vertical etch process along a vertical direction, the sub-patterning process may be performed so as to remove one of the sacrificial layers 130 and one of the insulating layers 120. Also, in the vertical etch process, along the horizontal direction, regions of the sacrificial layers 130 and the insulating layers 120 etched in the vertical etch process may be below the mask patterns 301 and 302 removed through the corresponding sub-patterning process and the sub-patterning process performed previously to the corresponding sub-patterning process. That is, the sacrificial layer 130 and the insulating layer 120, which are patterned in a previous sub-patterning process, may be further patterned during a subsequent sub-patterning process.

Therefore, the cumulative number of the sub-patterning processes performed with respect to the thin layer structure 100 may vary according to a distance from the cell array region CAR or the semiconductor patterns 205. According to a difference in the cumulative number of the sub-patterning processes, as shown in FIGS. 26 and 27, the thin layer structure 100 may be formed so as to have a stepwise contact structure in the word line contact region WCTR.

As aforementioned, the vertical etch process according to the present embodiment is performed not with respect to the horizontal interconnection structure 260S described in the first embodiment but with respect to the thin layer structure 100 including the sacrificial layers 130. Due to this difference, the vertical etch process according to the present embodiment may be performed by using an etch method or recipe which is different from that of the first embodiment. However, it will be understood to those skilled in the art that an optimal solution for the vertical etch process may be obtained without undue experimentation. Therefore, a description regarding modification of the first embodiment with respect to the vertical etch process will be omitted.

Referring to FIGS. 23 and 28 through 30, the sacrificial mask patterns 310 is removed and the sacrificial layers 130 are selectively removed from the thin layer structure 100 to form recess regions 240. Thereafter, the recess regions 240 are filled to form conductive patterns 260 facing sidewalls of the semiconductor patterns 205 (S3), and word line plugs WPLG connected with the conductive patterns 260 are formed (S5). Consequently, after the thin layer structure 100 is formed in a stepwise shape through the consumable etch process S43, the conductive patterns 260 are formed.

Figure 28:
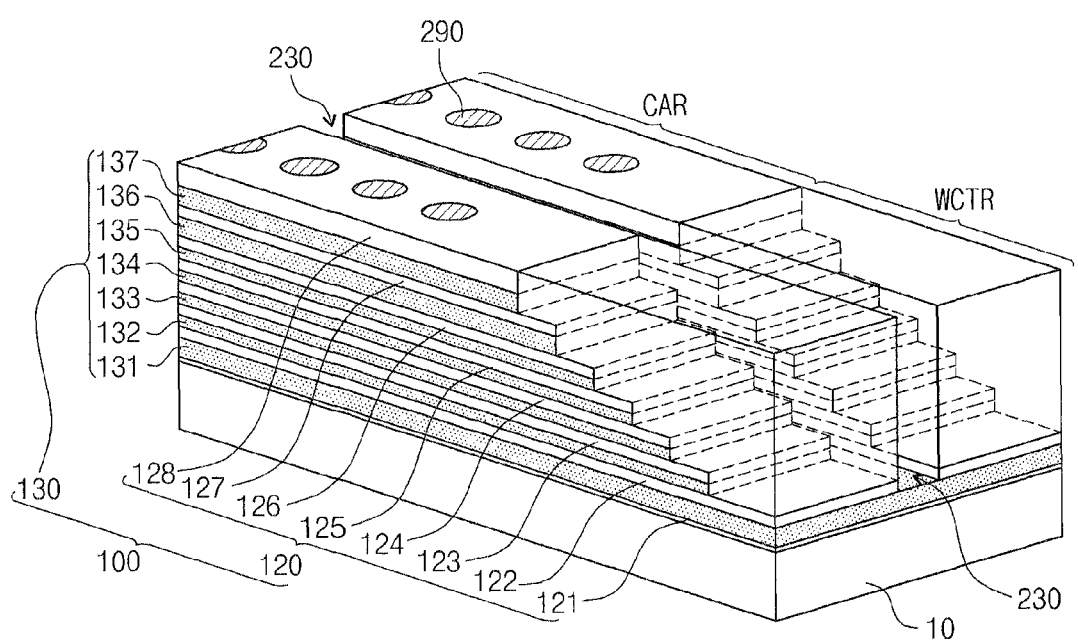
Figure 29:
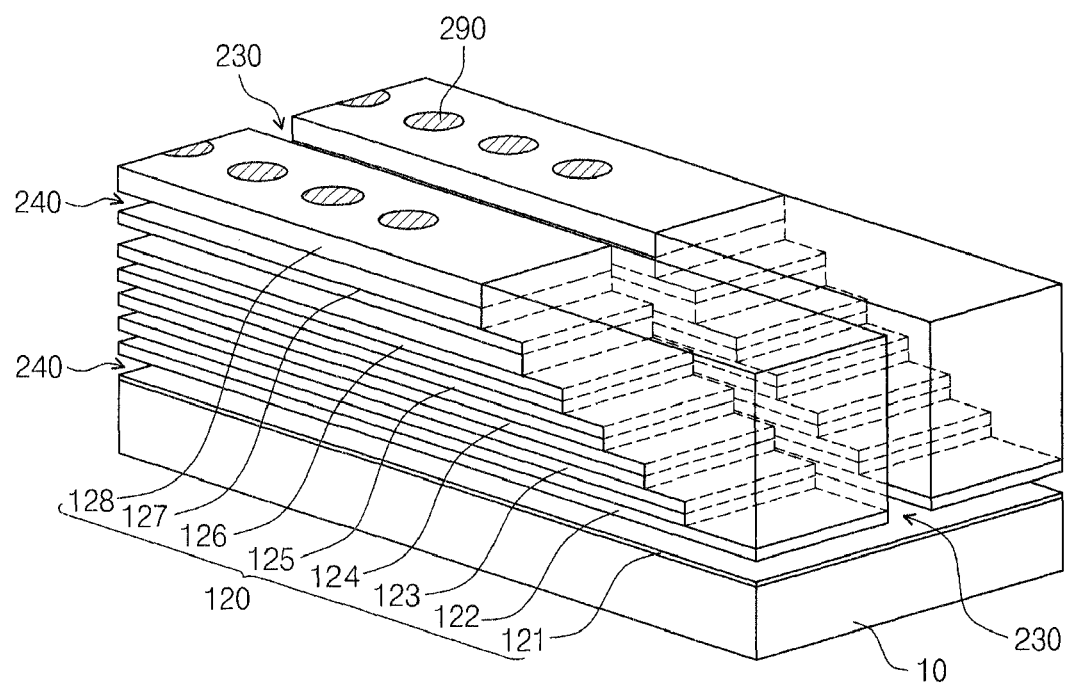

The forming of the recess regions 240 may include forming trenches 230 exposing sidewalls of the sacrificial layers 130 in the thin layer structure 100 as shown in FIG. 28 (S31), and selectively removing the exposed sacrificial layers 130 as shown in FIG. 29. The forming of the recess regions 240 may be performed by the same method as that of the embodiment described with reference to FIGS. 7 and 8.

Furthermore, as shown in FIG. 28, along the direction of the length, the trench 230 may be formed to extend from the cell array region CAR and cross the word line contact region WCTR. According to the first embodiment, as shown in FIG. 8, the trench 230 is formed so as not to cross the word line contact region WCTR so that the word lines WL may be formed in a comb shape or finger shape. However, according to the second embodiment, the trench 230 may be formed to cross the word line contact region WCTR and thus separate the thin layer structure 100 into a plurality of portions arranged horizontally. Alternatively, the trench 230 described with reference to FIG. 28 may be applied to the first embodiment, and the trench 230 described with reference to FIG. 7 may be applied to the second embodiment.

The forming S3 of the conductive patterns 260 may be performed by the same method as that of the embodiment described with reference to FIGS. 9 and 10. According to this method including replacing the sacrificial layers 130 with a conductive material, the recess regions 240 may be filled with an information storage layer 250 and conductive patterns 260 as shown in FIG. 30, and the conductive patterns 260 may be spatially separated by an electrode separating pattern (not illustrated) filling the trench 230.

Figure 30:
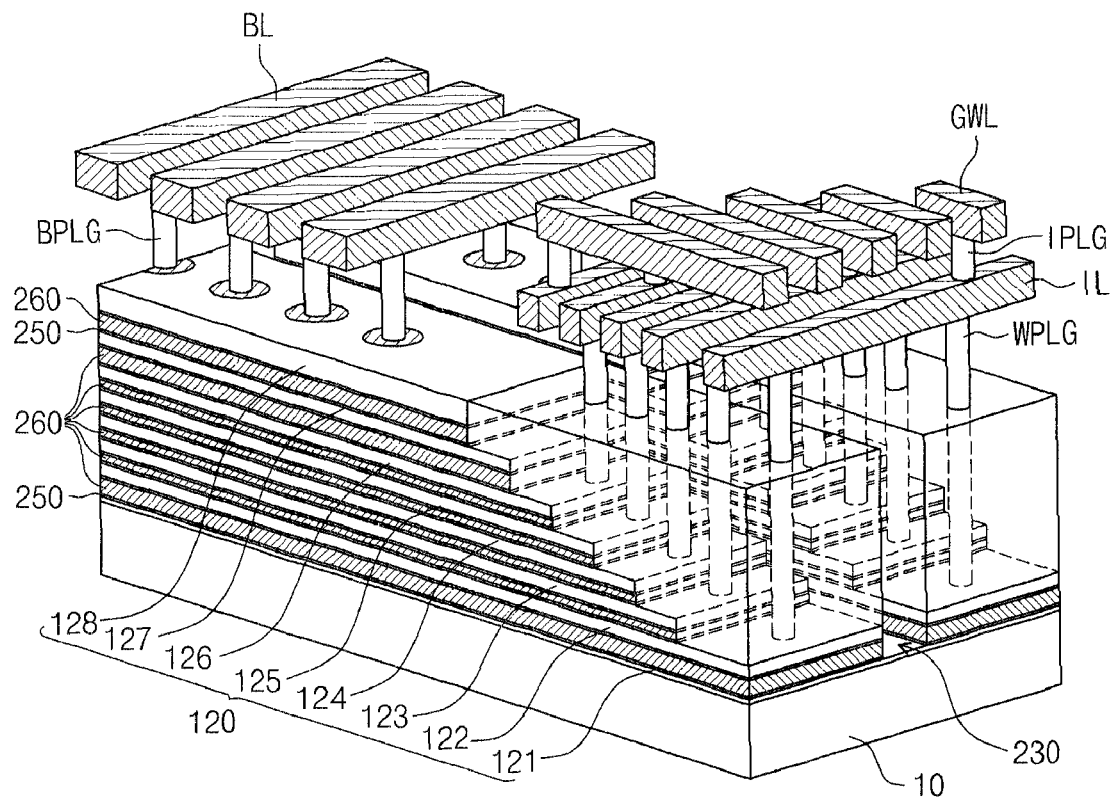

After the word line plugs WPLG are formed, global word lines GWL connected with the word line plugs WPLG may be additionally formed as shown in FIG. 30. In addition, bit line plugs BPLG connected with the semiconductor patterns 205 and bit lines BL connecting the bit line plugs BPLG may be formed. The word line plugs WPLG, the global word lines GWL, the bit line plugs BPLG and the bit lines BL may be formed by the same method as that in the embodiment described with reference to FIG. 18.

As discussed above, since the thin layer structure 100 including the sacrificial layers 130 is separated into the plurality of portions arranged horizontally, each of the conductive patterns 260 formed through the replacing process S32 may be separated horizontally by the trenches 230 to form a plurality of conductive lines. Therefore, the word line plugs WPLG according to the present embodiment are formed so as to be respectively connected with the conductive patterns 260 separated horizontally by the trench 230 as shown in FIG. 30. Further, the conductive patterns 260 disposed at the same height may be electrically connected with one of the global word lines GSL. For this purpose, an intermediate interconnection line IL connecting the plurality of word line plugs WPLG and an intermediate plug IPLG connecting the global word lines GWL may be disposed between the word line plugs WPLG and the global word lines GWL. According to an embodiment, a longer axis of the intermediate interconnection line IL may be disposed in a direction parallel to a longer axis of the bit line BL as shown in the figures.

Figure 31:
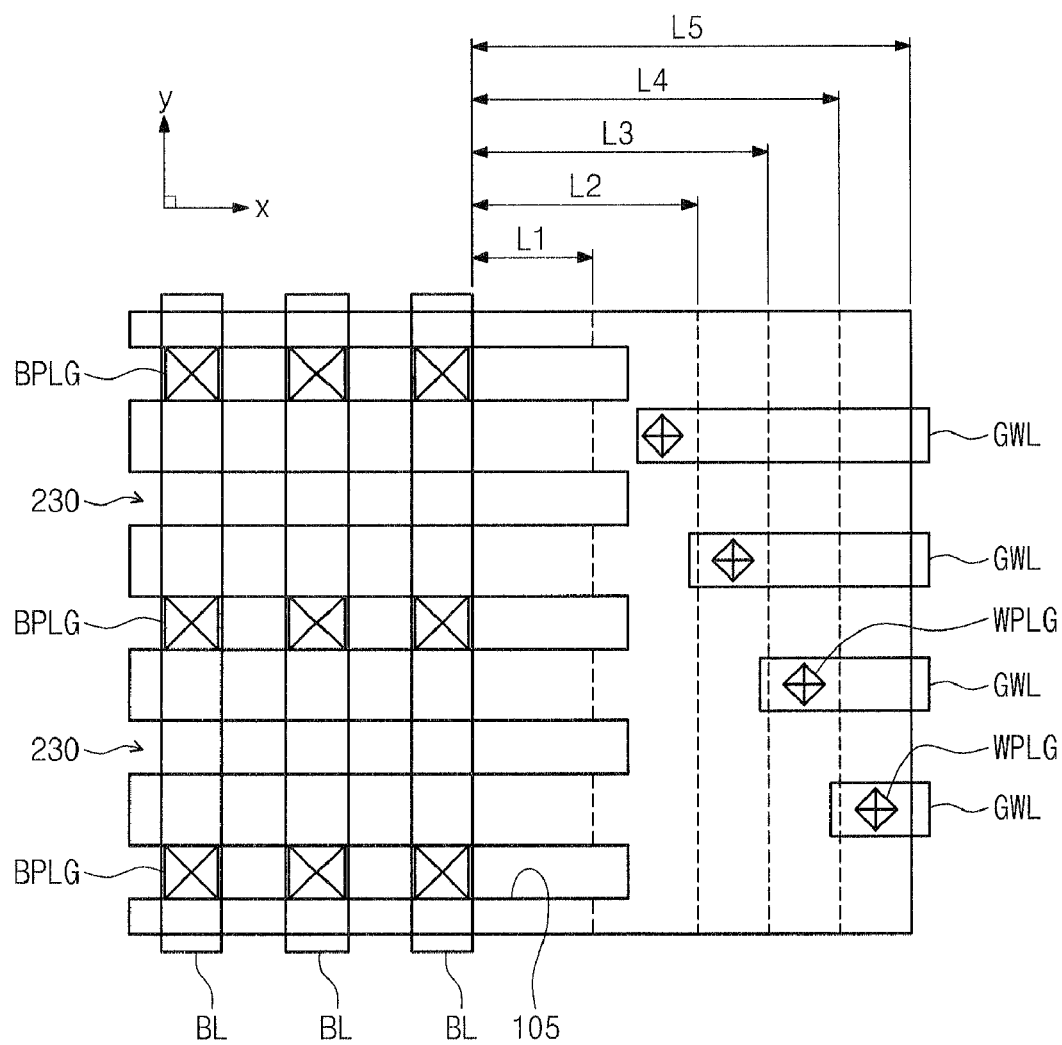
FIGS. 31 and 32 are plan view and graph for describing one of technical features that may found in a three dimensional semiconductor device according to some embodiments based on the technical spirit of the inventive concept.
Figure 32:
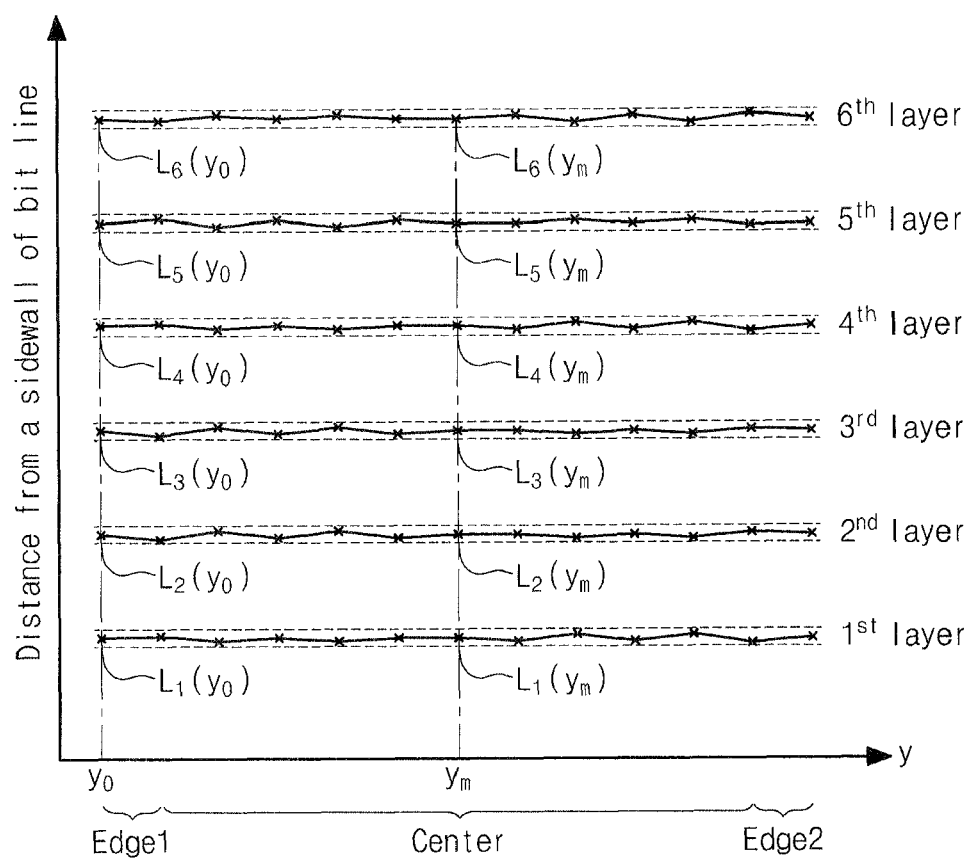

FIGS. 31 and 32 are a plan view and graph for describing one of technical features that may found in a three dimensional semiconductor device according to embodiments based on the technical spirit of the inventive concept. FIG. 31 is a detailed plan view of region 99 expressed by a dotted line of FIG. 1.

Referring to FIG. 31, longer axes of the conductive pattern 260 (not illustrated) and the bit line BL may be arranged parallel to the x-axis and y-axis, respectively. As explained above, since the conductive patterns 260 form a stepwise structure in the word line contact region WCTR, distances L1, L2, L3, L4, L5 between one sidewall of the conductive patterns 260 and one sidewall of the bit line BL may be different depending on stack heights of the corresponding conductive patterns as shown in the figures. That is, where n indicates the stacking order of the conductive patterns 260, as the distance between the substrate 10 and the conductive pattern 260 increases, the distance $L_n$ between the sidewall of the conductive pattern 260 and the sidewall of the bit line BL closest to the word line contact region WCTR, decreases.

Referring to FIG. 32, a vertical axis of the graph indicates a distance (i.e., $L_n$) between one sidewall of the conductive pattern 260 and one sidewall of the bit line BL closest to the conductive pattern 260, and a horizontal axis of the graph indicates a y-distance of a point (i.e., a y coordinate of a selected point) on one sidewall of a selected conductive pattern. In one conductive pattern, the distance Ln may be substantially independent from the y-coordinate. That is, since a curve of the distance Ln is positioned within an envelope having a narrow width, the curve is substantially uniform regardless of the y-coordinate. In other words, the conductive pattern 260 according to the foregoing embodiments may be substantially a straight line globally or locally.

According to embodiments based on the technical spirit of the inventive concept, the uniformity of the distance Ln or the straightness of the conductive pattern may be expressed quantitatively by the below equation 1.

$$L_n(y_m) - L_n(y_0) < \frac{L_n(y_0) - L_{n+1}(y_0)}{S}, \text{ for } |y_m - y_0| < y_1 \qquad < \text{Equation 1} >$$

where $y_0$ is a y coordinate of a reference point, $y_m$ is a y coordinate of a measured point, $L_n(y_m)$ is a distance between a sidewall of an n-th conductive pattern in which the y coordinate is $y_m$, and a sidewall of the bit line closest to the sidewall of the n-th conductive pattern, s is a value between about 2 to 20, and $y_1$ is a length shorter than a length of bit line BL.

According to a first aspect of the described embodiments, the parameter $y_1$ determining the range of measured points may be about 80% to about 100% of a length of the bit line BL or a side length of a memory block constituting the cell array region CAR. In this case, in the word line contact region WCTR, the sidewall of the n-th conductive pattern may have a global straightness. According to a second aspect of the described embodiments, the parameter $y_1$ may be about 80% to about 120% of a minimum width of the mask patterns 301, 302 or a spacing between the bit lines BL. In this case, the sidewall of the n-th conductive pattern may have a local straightness. The foregoing first aspect may be a result of the local straightness globally extending in the length direction of the bit line BL. A three dimensional semiconductor device according to embodiments of the inventive concept may have one of the first aspect and the second aspect, or may have both of the first aspect and the second aspect.

According to the foregoing embodiments, the mask patterns 301, 302 used in performing the consumable etch process S43 may allow the sidewall of the conductive pattern 260 to have the foregoing local straightness or global straightness. In particular, unlike the foregoing embodiments, if the mask patterns 301, 302 are not used in the consumable etch process S43, the sidewall of the sacrificial mask pattern 310 may be deformed from its original form as a result of repeated performing of the sub-patterning processes.

For example, though the sidewall of the sacrificial mask pattern 310 is first formed flat, in the case where the sub-patterning processes are repeated, the roughness of the sidewall may increase locally. In this case, the sidewall of the conductive pattern disposed at an upper portion may have a decreased local straightness, compared with a sidewall of the conductive pattern positioned at a lower portion.

Also, a corner of a pattern having a hexahedral shape may be etched deeper than a central portion thereof. Therefore, if the sub-patterning processes are repeated, a corner region of the sacrificial mask pattern 310 may be rounded gradually. In this case, in the word line contact region WCTR, the sidewall of the conductive pattern may be formed in an arc shape at first and second edges Edge 1 and Edge 2. That is, in the case where the mask patterns 301, 302 are not used in the consumable etch process S43, the conductive patterns 260 may not have a global straightness.

In addition, it is difficult to globally control a position of the sidewall of the sacrificial mask pattern 310 while the sub-patterning processes are repeated. Therefore, in each of the sub-patterning processes, the position of the sidewall of the sacrificial mask pattern 310 may be changed over a wide range, and such change is not easy to control. According to experiments conducted by the inventors, it was confirmed that the range of changes may be greater than a spacing between the word line contact plugs WPLG. On the other hand, if the mask patterns 301, 302 are not used in the consumable etch process S43, the change in the position of the sidewall of the sacrificial mask pattern 310 may cause a change in the position of a region (i.e., a top surface of an underlying conductive pattern exposed by a predetermined conductive pattern) for contacting the word line contact plug WPLG, so that an unintended electrical connection (e.g., short) between the word line contact plug and the conductive pattern 260 may be caused.

However, when the mask patterns 301, 302 are used in the consumable etch process S43 as in the foregoing embodiments based on the technical spirit of the inventive concept, the sacrificial mask pattern 310 is used as a mask for selectively removing one of the mask patterns 301, 302, and the mask patterns 301, 302 are used as an etch mask for patterning the thin layer structure 100 or the horizontal interconnection structure 260S. That is, in the word line contact region WCTR, the positions of the sidewalls of the conductive patterns 260 are defined not by the sacrificial mask pattern 310 but by the mask patterns 301, 302. Therefore, the foregoing technical limitations that may occur when the mask patterns 301, 302 are not used in the consumable etch process S43 can be prevented.

Figure 33:
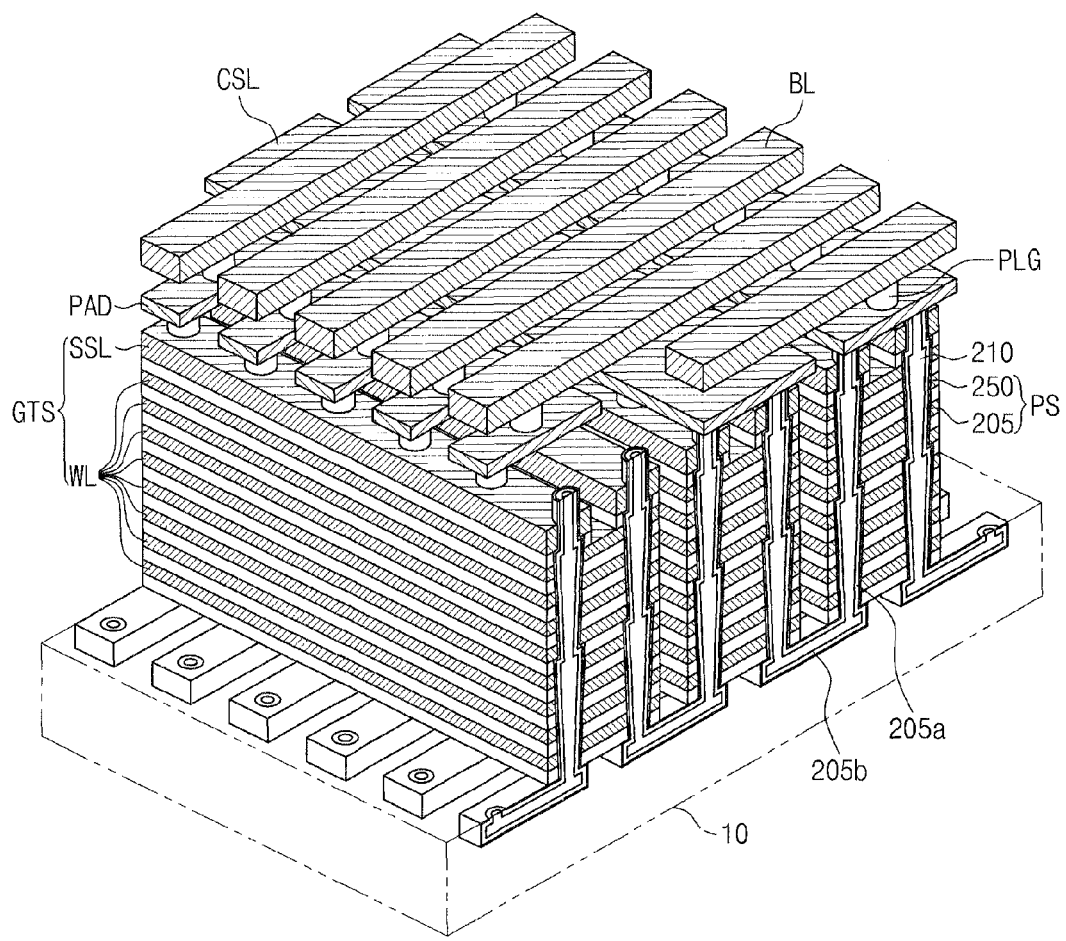
FIGS. 33 through 35 are perspective views for describing a three dimensional semiconductor device according to a third embodiment based on the technical spirit of the inventive concept.
Figure 34:
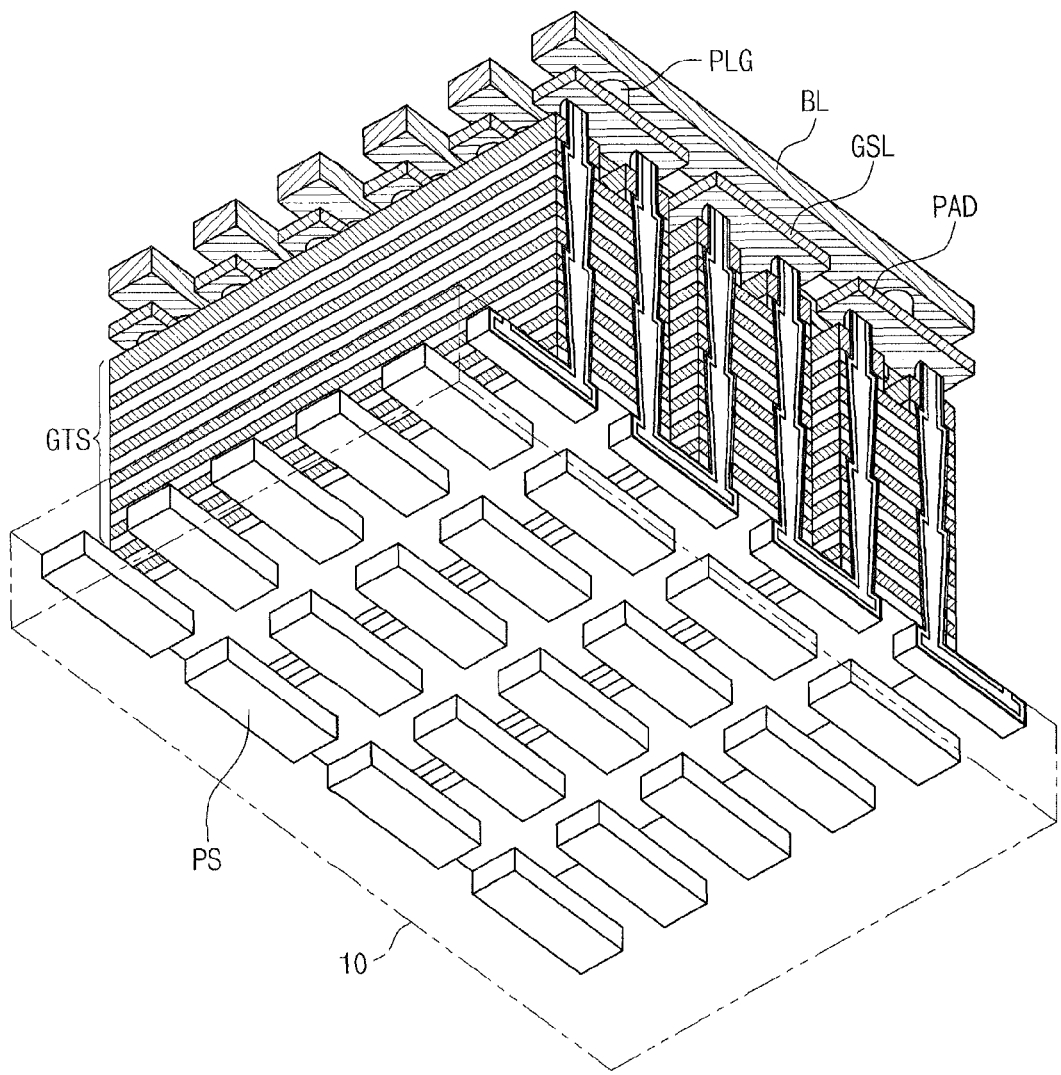
Figure 35:
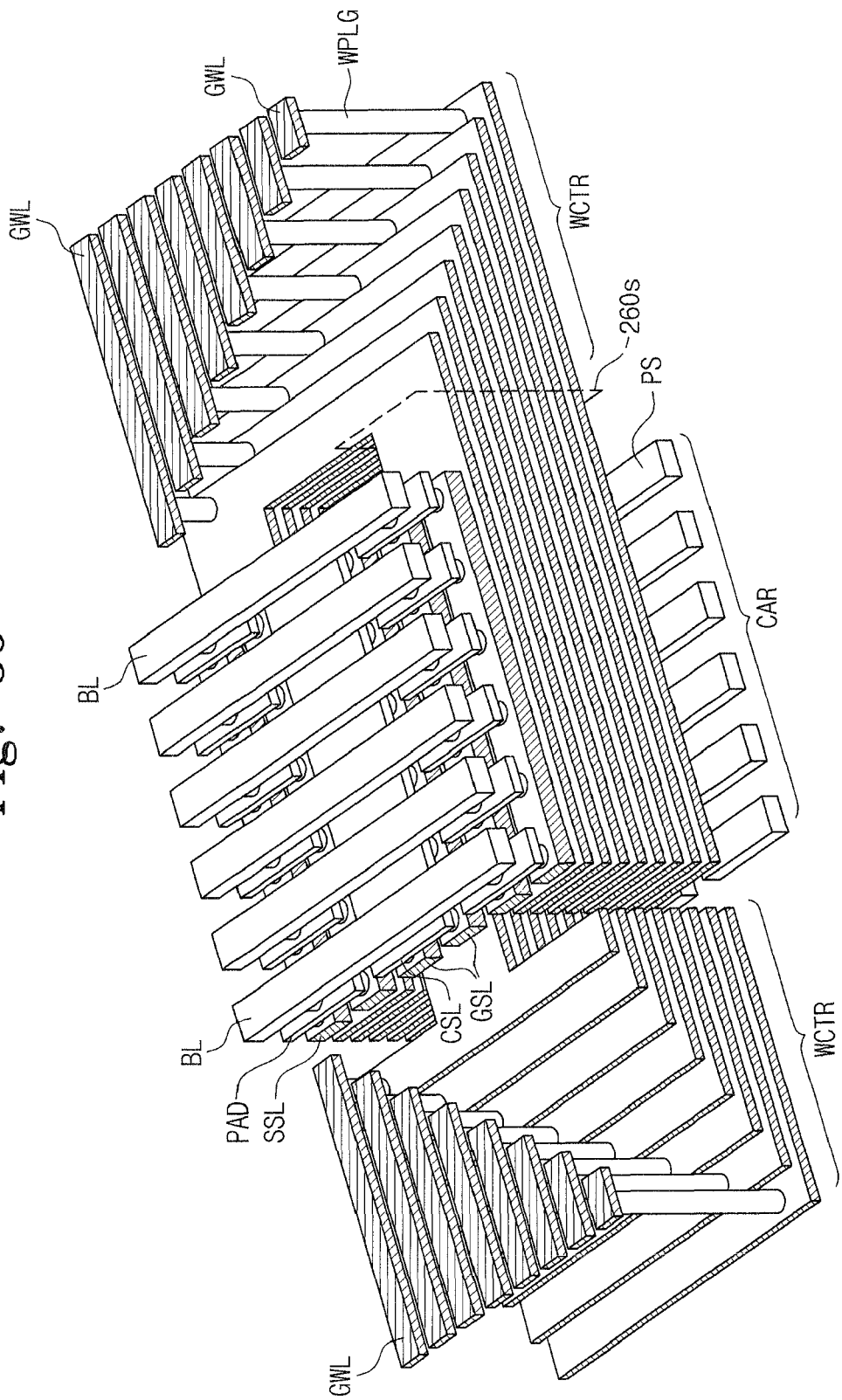

FIGS. 33 through 35 are perspective views for describing a three dimensional semiconductor device according to a third embodiment based on the technical spirit of the inventive concept. In detail, FIGS. 33 and 34 are perspective views of a semiconductor device viewed in two different directions as a third embodiment, and FIG. 35 is a perspective view illustrating an arrangement of word lines in this semiconductor device.

Referring to FIGS. 33 and 34, the semiconductor device according to this embodiment may include bit lines BL above a substrate 10, a gate structure GTS between the substrate 10 and the bit lines BL, a common source line CSL between the gate structure GTS and the bit lines BL, and a pipe structure PS penetrating the gate structure GTS. The pipe structure PS may have a U-shaped structure having both ends that may be respectively connected with the bit lines BL and the common source line CSL (not illustrated). A plug PLG and a pad PAD may be further disposed between the gate structure GTS and the bit line BL for electrical connection therebetween.

The gate structure GTS may include a plurality of word lines WL sequentially stacked, and select lines disposed between the word lines WL and the bit lines BL. The select line may include string select lines SSL disposed between the word line WL and the pad PAD, and a ground select line GSL disposed between the common source line CSL and the word line WL. The string select lines SSL and the ground select line GSL may be formed by using a process for forming the word lines WL or may be formed by using a process independent from the process for forming the word lines WL.

The word lines WL may further include one pair of global word lines GWL respectively disposed at corresponding ends of the word lines WL (not illustrated). As shown in FIG. 35, even word lines may be electrically connected with one of the one pair of global word lines and odd word lines may be electrically connected with the other of the one pair of global word lines.

The pipe structure PS may include a semiconductor pattern 205 and an information storage layer 250 covering an outer wall of the semiconductor pattern 205. Each of the semiconductor patterns 205 may include one pair of vertical semiconductor patterns 205a penetrating the gate structure GTS, and a horizontal semiconductor pattern 205b disposed below the gate structure GTS and connecting the vertical semiconductor patterns 205a. The two vertical semiconductor patterns 205a constituting the single semiconductor pattern 205 may penetrate the word lines WL separated from each other as shown in FIGS. 33 and 34. Also, the horizontal semiconductor patterns 205b may extend from a portion disposed below one word line WL to a portion disposed below another word line WL adjacent to the one word line WL.

The word lines WL may be configured to control an electric potential of the semiconductor pattern 205. Therefore, an electrical connection between the bit line BL and the common source line CSL may be controlled by the word lines WL, the string select line SSL and the ground select line GSL. According to the above configuration, the semiconductor pattern 205 may constitute a unit cell string of a NAND type cell array structure.

According to an embodiment, the gate structure GTS may be formed by using the fabricating method disclosed in the foregoing first embodiment or second embodiment. Also, according to an embodiment, the information storage layer 250 may be formed so as to cover the outer wall of the semiconductor pattern 205 as shown in FIGS. 33 and 34. According to another embodiment, the information storage layer 250 may extend horizontally from the semiconductor pattern 205 and the sidewalls of the word lines WL to cover top and bottom surfaces of the word line WL. For example, the semiconductor pattern 205 and the information storage layer 250 may be formed by modifying and applying the fabricating methods of the embodiments described with reference to FIGS. 2 through 30. In this case, as shown in FIG. 18, the information storage layer 250 may cover the top and bottom surfaces of the conductive pattern 260 (i.e., word line WL).

In some embodiments, the word lines WL may form a stepwise structure as shown in FIG. 35 by using the fabricating method of the foregoing first embodiment. In detail, as shown in FIG. 2, after the mask patterns 301, 302 and the sacrificial mask pattern 310 are sequentially formed on the word lines WL, the word lines WL may be patterned by using the mask patterns 301, 302 and the sacrificial mask pattern 310 as a consumable etch mask (S43). Likewise, since the mask patterns 301, 302 are used as an etch mask for patterning the word lines WL, the foregoing technical limitations that may occur when the mask patterns 301, 302 are not used in the consumable etch process S43 can be prevented with this embodiment. Also, the three dimensional semiconductor device according to this embodiment may have technical features described with reference to FIGS. 31 and 32.

Figure 36:
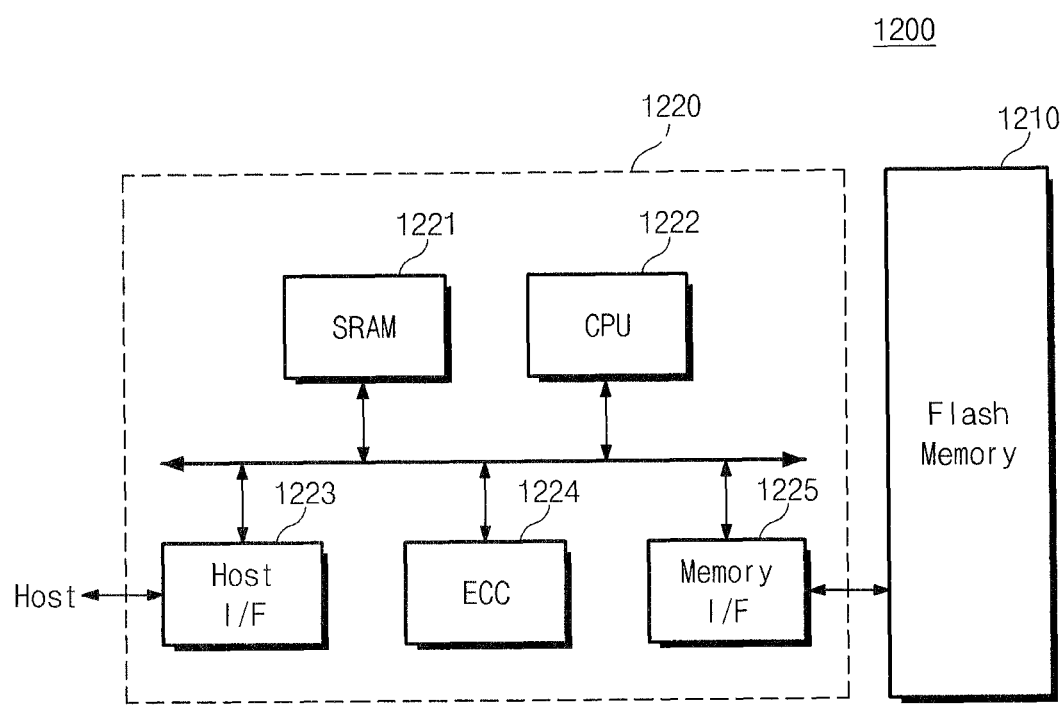
FIG. 36 is a block diagram of a memory card provided with a flash memory device according to an embodiment of the inventive concept.

FIG. 36 is a block diagram of a memory card 1200 for supporting high-capacity data storage capability provided with a flash memory device 1210 according to an embodiment of the inventive concept. The memory card 1200 may include a memory controller 1220 that controls data exchange between a host and the flash memory device 1210. In some embodiments, some of the elements shown in FIG. 36 such as the memory controller 1220 and/or the flash memory device may be included in a single semiconductor device as a system-on-chip (SoC).

An SRAM 1221 is used as a working memory of a central processing unit (CPU) 1222. A host interface 1223 has data exchange protocol of a host connected to the memory card 1200. An error correction code (ECC) 1224 detects and corrects an error included in data read from the multi-bit flash memory device 1210. A memory interface 1225 interfaces with the flash memory device 1210 according to the inventive concept. The CPU 1222 performs an overall control operation for data exchange of the memory controller 1220. Although not shown in the drawings, it will be apparent to those skilled in the art that the memory card 1200 may further include a ROM (not shown) storing code data for interfacing with the host.

According to the flash memory device and the memory card or the memory system of the inventive concept, a memory system with high reliability can be provided through the flash memory device 1210 in which erase characteristics of dummy cells are improved. Especially, the flash memory device according to embodiments of the present invention can be provided in a memory system such as solid state disk (hereinafter referred to as 'SSD'). In this case, read error caused by dummy cells can be prevented to realize a memory system with high reliability.

Figure 37:
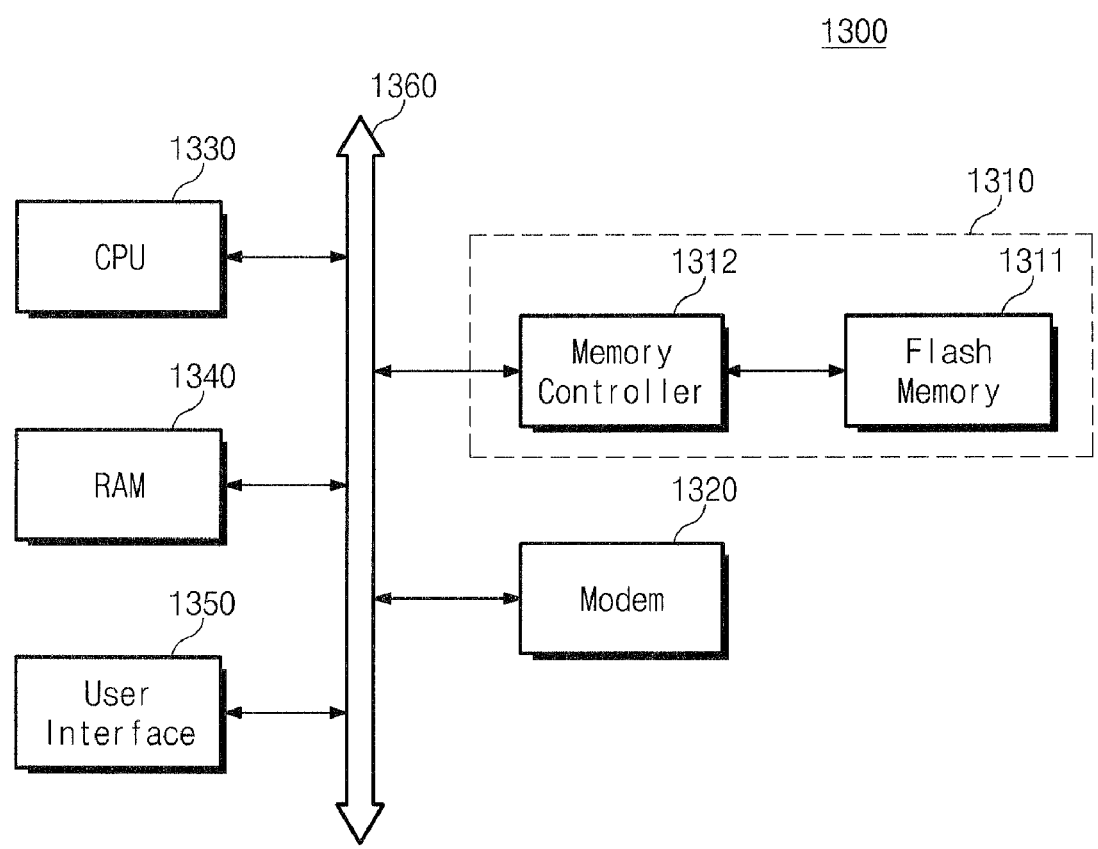
FIG. 37 is a block diagram of an information processing system provided with a flash memory system according to some embodiments of the inventive concept.

FIG. 37 is a block diagram of an information processing system 1300 provided with a flash memory system 1310 according to some embodiments of the inventive concept. Referring to FIG. 37, the flash memory system 1310 according to the inventive concept is provided in an information processing system, such as a mobile device and a desktop computer. The information processing system 1300 according to the inventive concept includes the flash memory system 1310, a modem 1320, a central processing unit (CPU) 1330, a RAM 1340, and a user interface 1350 that are electrically connected to a system bus 1360, respectively. The flash memory system 1310 may have substantially the same configuration as the foregoing memory system or flash memory system. Data processed by the CPU 1330 or external input data is stored in the flash memory system 1310. Herein, the foregoing flash memory system 1310 may be configured with a semiconductor disk device (SSD). In this case, the information processing system 1300 can stably store high-capacity data in the flash memory system 1310. Also, as the reliability of the semiconductor device is improved, the flash memory system 1310 can save resources consumed in error correction, thus providing a high-speed data exchange function to the information processing system 1300. Although not illustrated in the drawings, it will be apparent to those skilled in the art that the information processing system 1300 may further include an application chipset, a camera image processor (CIS), and an input/output device.

Also, the flash memory device or the memory system according to the inventive concept may be mounted in various types of packages. Examples of the packages of the flash memory device or the memory system according to the inventive concept include Package on Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), Thin Quad Flat Pack (TQFP), System In Package (SIP), Multi Chip Package (MCP), Wafer-level Fabricated Package (WFP), and Wafer-level Processed Stack Package (WSP).

According to the embodiments based on the technical spirit of the inventive concept, mask patterns formed below a sacrificial mask pattern are used as an etch mask in a consumable etch process. In detail, the sacrificial mask pattern is used as an etch mask for selectively removing one of the mask patterns, and the mask patterns are used as an etch mask in a patterning process for forming a stepwise structure. As a result, sidewalls of the word lines are defined not by the sacrificial mask pattern but by the mask patterns, and a contact region for contact between a word line contact plug and the word lines may be also defined not by the sacrificial mask pattern but by the mask patterns. Therefore, the sidewalls of the word lines may be formed in parallel with each other, locally and globally. In addition, a positional change of the contact region and an unintended electrical connection (e.g., short) between the word line contact plugs and the word lines due to the positional change can be prevented. The above-disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Reference throughout this specification to "one embodiment" "some embodiments" or "an embodiment" means that a particular feature, structure, or characteristic described in connection with the embodiment is included in at least one embodiment of the present invention. Thus, the appearances of the phrases "in one embodiment," "some embodiments," or "in an embodiment" in various places throughout this specification are not necessarily all referring to the same embodiment. Furthermore, the particular features, structures, or characteristics may be combined in any suitable manner in one or more embodiments.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention. Various operations will be described as multiple discrete steps performed in a manner that is most helpful in understanding the invention. However, the order in which the steps are described does not imply that the operations are order-dependent or that the order that steps are performed must be the order in which the steps are presented.

What is claimed is:

1. A method of fabricating a three dimensional semiconductor device, the method comprising;
   forming a layer structure comprising a plurality of sequentially stacked layers on a substrate;
   forming a mask structure comprising a plurality of horizontally arranged mask patterns on the layer structure;
   forming a sacrificial mask pattern on the mask structure; and
   forming a stepwise contact structure by patterning the layer structure using the mask structure and the sacrificial mask pattern as a consumable etch mask.

2. The method of claim 1, wherein patterning the layer structure comprises a plurality of sub-patterning processes, each of the plurality of sub-patterning processes comprising:
   exposing one of the mask patterns covered by the sacrificial mask pattern used in a sub-patterning process performed before the exposing;
   removing the exposed mask pattern; and
   etching a portion of the layer structure below the removed mask pattern.

3. The method of claim 2, wherein etching the layer structure comprises etching the layer structure etched in the previous sub-patterning process.

4. The method of claim 2, wherein exposing one of the mask patterns comprises horizontally etching a sidewall of the sacrificial mask pattern.

5. The method of claim 2, wherein forming the mask structure comprises alternately forming first mask patterns and second mask patterns arranged horizontally, and wherein the first mask patterns are formed of a material different from that of the second mask patterns.

6. The method of claim 5, wherein the first mask patterns and the second mask patterns are located at different heights.

7. The method of claim 5, wherein prior to forming the sacrificial mask pattern, the method further comprising:
   forming active semiconductor patterns penetrating the plurality of sequentially stacked layers; and
   forming doped semiconductor patterns contacting an upper region of each of the active semiconductor patterns,
   wherein the first mask patterns are formed using the doped semiconductor patterns.

8. The method of claim 7, wherein the first mask patterns and the doped semiconductor patterns are doped with an impurity comprising a conductive type which is different from that of the active semiconductor patterns.

9. The method of claim 1, wherein each of the mask patterns is formed thicker than a maximum thickness of each of the layers.

10. The method of claim 1, wherein the substrate comprises a cell array region in which memory cells are disposed, and a contact region disposed on at least one side of the cell array region,
   the three dimensional semiconductor device further comprises active semiconductor patterns penetrating the layer structure in the cell array region,
   wherein a deviation in distance between the mask patterns and the active semiconductor patterns adjacent to the mask patterns is smaller than half of a distance between the sidewalls of the mask patterns.

11. The method of claim 10, wherein the sidewall of one of the mask patterns meets the below equation $$L(y_m) - L(y_0) < \frac{W(y_0)}{s},$$

within a range of $y_m$ meeting the condition of $|y_m - y_0| < y_1$, where $y_0$ is a y coordinate of a reference point, $y_n$, is a y coordinate of a measured point, $L_n(y_m)$ is a distance between one point on one sidewall of the mask pattern in which the y coordinate is $y_m$, and an edge of the cell array region, $W(y_0)$ is a width of a corresponding mask pattern, s is a value between about 2 to 20, and $y_1$ is a length shorter than a length of the mask pattern.

12. The method of claim 11, wherein the parameter $y_1$ is about 80% to about 100% of the length of the bit line.

13. The method of claim 11, wherein the parameter y1 is about 80% to about 120% of the width of the mask pattern.

14. A method of fabricating a three dimensional semiconductor device, the method comprising:
   forming a layer structure comprising a plurality of sequentially stacked layers on a substrate;
   forming a mask structure comprising a plurality of horizontally arranged mask patterns on the layer structure; and
   forming a pattern structure comprising a stepwise contact structure by patterning the layer structure,
   wherein forming the pattern structure comprises a plurality of sub-patterning processes, each of the plurality of sub-patterning processes comprising a horizontal etch process selectively removing at least one of the mask patterns, and a vertical etch process etching the layer structure disposed below the mask pattern removed in the horizontal etch process.

15. The method of claim 14, wherein each of the sub-patterning processes comprises etching the layer structure etched in a previous sub-patterning process.

* * * * *